US012796270B2

(12) United States Patent
Huang et al.

(10) Patent No.: US 12,796,270 B2
(45) Date of Patent: Nov. 10, 2026

(54) DISPLAY PANEL, METHOD FOR MANUFACTURING THE SAME, AND DISPLAY DEVICE

(71) Applicant: BOE Technology Group Co., Ltd., Beijing (CN)

(72) Inventors: Wei Huang, Beijing (CN); Shi Shu, Beijing (CN); Wei Li, Beijing (CN); Zhongyuan Sun, Beijing (CN); Qian Jin, Beijing (CN); Guangcai Yuan, Beijing (CN); Lu Wang, Beijing (CN); Yichi Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 876 days.

(21) Appl. No.: 17/790,333

(22) PCT Filed: Sep. 1, 2021

(86) PCT No.: PCT/CN2021/115974

§ 371 (c)(1),
(2) Date: Jun. 30, 2022

(87) PCT Pub. No.: WO2022/083304

PCT Pub. Date: Apr. 28, 2022

(65) Prior Publication Data

US 2023/0037592 A1 Feb. 9, 2023

(30) Foreign Application Priority Data

Oct. 22, 2020 (CN) ........................ 202011143647.1

(51) Int. Cl.
*H10K 59/38* (2023.01)
*H10K 59/122* (2023.01)
*H10K 59/80* (2023.01)

(52) U.S. Cl.
CPC ........... *H10K 59/38* (2023.02); *H10K 59/122* (2023.02); *H10K 59/873* (2023.02); *H10K 59/8731* (2023.02); *H10K 59/875* (2023.02)

(58) Field of Classification Search
CPC .... H10K 59/38; H10K 59/122; H10K 59/873; H10K 59/8731; H10K 59/875; H10K 50/865; H10K 50/125; H10K 2102/351
See application file for complete search history.

(56) References Cited

U.S. PATENT DOCUMENTS 9,786,712 B2 10/2017 Fujimoto et al.
10,197,861 B1 2/2019 Bae et al.
(Continued)

FOREIGN PATENT DOCUMENTS

CN 105408771 A 3/2016
CN 106935713 A 7/2017
(Continued)

OTHER PUBLICATIONS

Extended European Search Report dated Oct. 24, 2023, for corresponding European Application No. 21881723.7, 10 pages.

*Primary Examiner* — Fernando L Toledo
*Assistant Examiner* — Marshall Mu-Nuo Hatfield
(74) *Attorney, Agent, or Firm* — Westman, Champlin & Koehler, P.A.

(57) ABSTRACT

A display panel having a base substrate, a light emitting layer on a side of the base substrate, and a wavelength converting layer on a side of light emitting layer away from the base substrate is provided. The light emitting layer includes light emitting units and a first pixel defining layer defining the plurality of light emitting units, the wavelength converting layer includes wavelength converting units and a second pixel defining layer defining the wavelength converting units, each of the wavelength converting units converts a wavelength of a light emitted by at least one of the (Continued)

light emitting units, wherein in a direction perpendicular to the base substrate, the second pixel defining layer has a thickness twice or more that of the first pixel defining layer. A method for manufacturing the display panel and a display device are also provided.

20 Claims, 12 Drawing Sheets

(56) References Cited

U.S. PATENT DOCUMENTS

| | | | |
|---|---|---|---|
| 10,825,871 B2 | 11/2020 | Yun et al. | |
| 10,879,317 B2 | 12/2020 | Yun et al. | |
| 10,985,218 B2 | 4/2021 | Park et al. | |
| 11,164,927 B2 | 11/2021 | Sim et al. | |
| 11,204,518 B2 | 12/2021 | Lee et al. | |
| 11,342,388 B2 | 5/2022 | Yun et al. | |
| 11,362,148 B2 * | 6/2022 | Zhang | B41M 3/003 |
| 2014/0027725 A1 | 1/2014 | Lim et al. | |
| 2014/0062292 A1 | 3/2014 | Seong | |
| 2016/0163763 A1 | 6/2016 | Fujimoto et al. | |
| 2016/0276418 A1 * | 9/2016 | Xu | H10K 59/122 |
| 2017/0018602 A1 | 1/2017 | Yun et al. | |
| 2017/0133619 A1 * | 5/2017 | Hasegawa | H10K 50/814 |
| 2017/0186819 A1 | 6/2017 | Yun et al. | |
| 2017/0237033 A1 * | 8/2017 | Koshihara | H10K 59/131 257/88 |
| 2018/0366672 A1 | 12/2018 | Wang | |
| 2019/0033664 A1 | 1/2019 | Bae et al. | |
| 2019/0172874 A1 * | 6/2019 | Lim | H10K 50/11 |
| 2019/0348472 A1 | 11/2019 | Yun et al. | |
| 2020/0035761 A1 | 1/2020 | Hack et al. | |
| 2020/0058721 A1 | 2/2020 | Sim et al. | |
| 2020/0106039 A1 * | 4/2020 | Li | H10K 50/131 |
| 2020/0135811 A1 * | 4/2020 | Jung | G02B 1/10 |
| 2020/0152704 A1 * | 5/2020 | Jang | H10K 59/1201 |
| 2020/0227485 A1 | 7/2020 | Park et al. | |
| 2020/0257162 A1 * | 8/2020 | Lee | G02F 1/133512 |
| 2020/0264461 A1 | 8/2020 | Kuwana et al. | |
| 2021/0050388 A1 | 2/2021 | Song | |
| 2021/0083011 A1 | 3/2021 | Yun et al. | |
| 2021/0367186 A1 * | 11/2021 | Zhao | H10K 59/122 |
| 2022/0285448 A1 | 9/2022 | Yun et al. | |

FOREIGN PATENT DOCUMENTS

| | | | | |
|---|---|---|---|---|
| CN | 106960913 A | | 7/2017 | |
| CN | 109103344 A | | 12/2018 | |
| CN | 109298569 A | | 2/2019 | |
| CN | 109950425 A | | 6/2019 | |
| CN | 110212004 A | * | 9/2019 | H10K 59/878 |
| CN | 110611035 A | | 12/2019 | |
| CN | 110828688 A | | 2/2020 | |
| CN | 110993674 A | | 4/2020 | |
| CN | 111051934 A | | 4/2020 | |
| CN | 111435673 A | | 7/2020 | |
| CN | 112397547 A | | 2/2021 | |
| CN | 110047903 B | * | 4/2022 | H10K 71/00 |
| EP | 3693999 A1 | | 8/2020 | |
| KR | 20190136737 A | | 12/2019 | |

* cited by examiner (a)

(b)

(a)

(b)

(c)

(d)

(e)

(a) (b)
(c) (d)
(e) (f)

(a)

(b)

DISPLAY PANEL, METHOD FOR MANUFACTURING THE SAME, AND DISPLAY DEVICE

CROSS REFERENCE TO RELATED APPLICATION

This application is a Section 371 National Stage Application of International Application No. PCT/CN2021/115974, files on Sep. 1, 2021, entitled "DISPLAY PANEL, METHOD FOR MANUFACTURING THE SAME, AND DISPLAY DEVICE", which published as WIPO Publication NO. WO 2022/083304 A1, on Apr. 28, 2022, not in English, which claims priority to Chinese Patent Application No. 202011143647.1, filed om Oct. 22, 2020, the disclosures of which are incorporated herein by reference in their entireties.

FIELD

The present disclosure relates to the technical field of color display, and particularly to a display panel, a manufacture method therefor and a display device.

BACKGROUND

Organic light emitting display (OLED) as an mainstream display technology has occupied the market of mobile display, and also attracts significant interest of the manufactures in the display application such as TV. From the perspective of display colors, the technical route of OLED is mainly divided into two types. One is to use organic light emitting materials which emit different colors respectively (such as red light emitting material, green light emitting material and blue light emitting material) to form sub-pixels with different colors, which is called the RGB type. The RGB type has a high color gamut, and has occupied the market of small size applications. However, it cannot be scaled up to large area because it is limited by the fine metal mask (FMM) process. Although the RGB type where RGB OLEDs are ink jet printed is a potential technology for large scale OLED, the color gamut is not high enough due to the limitation on the research and development of the OLED material available in solution processes. The other is to use an OLED as a backlight source in combination with color films to achieve the color display, which is called the backlight-color film type. The configuration in which a white backlight is combined with color films is one of the mainstream technologies for large scale OLED because it may be achieved by evaporation on the entire surface with an open mask. In the white backlight-color film technology, the color films function to filter light with a wavelength other than that for the desired color from the white light. The color gamut of the color films directly limits the color gamut range of the large scale OLED product.

A technology where a wavelength converting component is used to change the color of the light emitted by a single color OLED to achieve the color display has emerged. For example, a technology combining a blue OLED with quantum dots (QDs) has been proposed in related art, where the blue OLED is used as a light source to cooperate with the QDs to down-convert blue light into red light and green light, thereby achieving the color display. Such a technology is called the QD-OLED.

There is still a need for improving the display device comprising a wavelength converting component.

SUMMARY

In an aspect, the present disclosure provides a display panel comprising:

a base substrate, a light emitting layer on a side of the base substrate, and a wavelength converting layer on a side of the light emitting layer away from the base substrate, wherein the light emitting layer comprises a plurality of light emitting units and a first pixel defining layer defining the plurality of light emitting units, the wavelength converting layer comprises a plurality of wavelength converting units and a second pixel defining layer defining the plurality of wavelength converting units, and each of the plurality of wavelength converting units is configured to convert a wavelength of a light emitted by at least one of the plurality of light emitting units, wherein in a direction perpendicular to the base substrate, the second pixel defining layer has a thickness twice or more that of the first pixel defining layer.

Optionally, an area of a light-incoming surface of each of the wavelength converting units is greater than an area of a light-exiting surface of the light emitting unit which emits a light to be converted by the wavelength converting unit.

Optionally, an orthographic projection of the second pixel defining layer on the base substrate is within an orthographic projection of the first pixel defining layer on the base substrate.

Optionally, a first encapsulation layer on a side of the light emitting layer close to the wavelength converting layer, wherein the first encapsulation layer comprises a first inorganic layer and a second inorganic layer on a side of the first inorganic layer away from the light emitting layer, the second inorganic layer comprises a stack of a plurality of inorganic sub-layers, and the stack has a reflectivity for a light with a wavelength converted by the wavelength converting unit greater than a reflectivity for a light emitted by the light emitting unit, and has a transmittance for a light emitted by the light emitting unit greater than a transmittance for a light with a wavelength converted by the wavelength converting unit.

Optionally, in a direction perpendicular to the base substrate, the first encapsulation layer has a thickness in a range from 1 to 6 μm.

Optionally, the display panel further comprises:

a color film layer on a side of the wavelength converting unit away from the light emitting layer, wherein the color film layer comprises a plurality of color film units and a black matrix defining the plurality of color film units.

Optionally, an orthographic projection of the black matrix on the base substrate is within an orthographic projection of the second pixel defining layer on the base substrate.

Optionally, in a direction perpendicular to the base substrate, the first pixel defining layer has a thickness in a range from 1 to 2 μm, and the second pixel defining layer has a thickness in a range from 6 to 20 μm.

Optionally, in a direction away from the base substrate, the plurality of light emitting units comprise an anode, a light emitting layer, and a cathode in this order, wherein a distance between a surface of the cathode away from the base substrate and a surface of the wavelength converting unit close to the base substrate is less than the thickness of the second pixel defining layer, and is greater than the thickness of the first pixel defining layer.

Optionally, the wavelength converting layer further comprises a transparent unit disposed in the same layer as the plurality of wavelength converting units, wherein the second pixel defining layer is provided between the transparent unit and the wavelength converting units.

Optionally, for a cross sectional shape of the first pixel defining layer in a direction perpendicular to the base substrate, a straight line passing through a point of the cross sectional shape furthest away from the base substrate and parallel to the base substrate is used as a first edge, a line segment passing through two ends of a boundary between the cross sectional shape and a neighboring layer on a side of the cross sectional shape close to the base substrate is used as a second edge, and straight lines passing through the two ends respectively and extending to the first edge and being tangent to the cross sectional shape are used as a third edge and a fourth edge respectively, wherein in a quadrilateral enclosed by the first, second, third and fourth edges, each of an angle between the second edge and the third edge and an angle between the second edge and the fourth edge is in a range from 20° to 40°.

Optionally, a material for the first pixel defining layer is different from that for the second pixel defining layer.

Optionally, the display panel further comprises:

- a filling layer between the light emitting layer and the wavelength converting layer, and
- a dam layer, wherein the dam layer together with the light emitting layer and the wavelength converting layer encloses the filling layer.

Optionally, for a cross sectional shape of the second pixel defining layer in a direction perpendicular to the base substrate, a straight line passing through a point of the cross sectional shape closest to the base substrate and parallel to the base substrate is used as a first edge, a line segment passing through two ends of a boundary between the cross sectional shape and a neighboring layer on a side of the cross sectional shape away from the base substrate is used as a second edge, and straight lines passing through the two ends respectively and extending to the first edge and being tangent to the cross sectional shape are used as a third edge and a fourth edge respectively, wherein in a quadrilateral enclosed by the first, second, third and fourth edges, each of an angle between the first edge and the third edge and an angle between the first edge and the fourth edge is in a range from 60° to 90°.

Optionally, a contact angle of deionized water on a surface of the second pixel defining layer is ≥90°, and a contact angle of propylene glycol methyl ether acetate on the surface of the second pixel defining layer is ≥35°, and

- in the quadrilateral, each of the angle between the first edge and the third edge and the angle between the first edge and the fourth edge is in a range from 60° to 85°.

Optionally, the dam layer has a thickness in a range from 15 to 50 μm, and the filling layer has a thickness in a range from 5 to 30 μm.

Optionally, the plurality of wavelength converting units lap a surface of the second pixel defining layer close to the base substrate.

Optionally, a lapping width of the wavelength converting units on the second pixel defining layer is within 10% of a width of the surface, which is lapped, of the second pixel defining layer.

Optionally, the plurality of wavelength converting units comprise a first color wavelength converting unit and a second color wavelength converting unit disposed adjacent to each other, wherein the first color wavelength converting unit and the second color wavelength converting unit have different lapping widths on the second pixel defining layer which separates the first color wavelength converting unit from the second color wavelength converting unit.

Optionally, the display panel further comprises:

- a color film layer on a side of the wavelength converting unit away from the light emitting layer,
- wherein the color film layer comprises a plurality of color film units and a black matrix defining the plurality of color film units,
- the plurality of color film units lap a surface of the black matrix close to the base substrate, and
- a lapping width of the wavelength converting unit on the second pixel defining layer is different from a lapping width of the color film unit, which belongs to the same sub-pixel as the wavelength converting unit, on the black matrix.

Optionally, the wavelength converting layer is contacted with the first encapsulation layer, and the first encapsulation layer is contacted with the light emitting layer.

Optionally, for a cross sectional shape of the second pixel defining layer in a direction perpendicular to the base substrate, a straight line passing through a point of the cross sectional shape furthest away from the base substrate and parallel to the base substrate is used as a first edge, a line segment passing through two ends of a boundary between the cross sectional shape and a neighboring layer on a side of the cross sectional shape close to the base substrate is used as a second edge, and straight lines passing through the two ends respectively and extending to the first edge and being tangent to the cross sectional shape are used as a third edge and a fourth edge respectively, wherein in a quadrilateral enclosed by the first, second, third and fourth edges, each of an angle between the second edge and the third edge and an angle between the second edge and the fourth edge is in a range from 70° to 90°.

Optionally, a contact angle of deionized water on a surface of the second pixel defining layer is ≥90°, and a contact angle of propylene glycol methyl ether acetate on the surface of the second pixel defining layer is ≥35°, and

- for a cross sectional shape of the second pixel defining layer in a direction perpendicular to the base substrate, a straight line passing through a point of the cross sectional shape furthest away from the base substrate and parallel to the base substrate is used as a first edge, a line segment passing through two ends of a boundary between the cross sectional shape and a neighboring layer on a side of the cross sectional shape close to the base substrate is used as a second edge, and straight lines passing through the two ends respectively and extending to the first edge and being tangent to the cross sectional shape are used as a third edge and a fourth edge respectively, wherein in a quadrilateral enclosed by the first, second, third and fourth edges, each of an angle between the second edge and the third edge and an angle between the second edge and the fourth edge is in a range from 95° to 120°.

Optionally, the plurality of wavelength converting units lap a surface of the second pixel defining layer away from the base substrate.

Optionally, a lapping width of the wavelength converting units on the second pixel defining layer is within 10% of a width of the surface, which is lapped, of the second pixel defining layer.

Optionally, the plurality of wavelength converting units comprise a first color wavelength converting unit and a second color wavelength converting unit disposed adjacent to each other, wherein the first color wavelength converting unit and the second color wavelength converting unit have different lapping widths on the second pixel defining layer which separates the first color wavelength converting unit from the second color wavelength converting unit.

Optionally, a color film layer on a side of the wavelength converting unit away from the light emitting layer, wherein the color film layer comprises a plurality of color film units and a black matrix defining the plurality of color film units, the plurality of color film units lap a surface of the black matrix away from the base substrate, and a lapping width of the wavelength converting unit on the second pixel defining layer is different from a lapping width of the color film unit, which belongs to the same sub-pixel as the wavelength converting unit, on the black matrix.

Optionally, the quadrilateral is a trapezoid with the third edge and the fourth edge as legs.

Optionally, the second pixel defining layer is a light-reflecting-type pixel defining layer or a light-absorbing-type pixel defining layer.

Optionally, the second pixel defining layer comprises scattering particles, or a metal is provided on a surface of the second pixel defining layer close to the wavelength converting unit.

Optionally, the wavelength converting unit is a quantum dot down-conversion unit.

Optionally, the display panel comprises a green sub-pixel, a red sub-pixel and a blue sub-pixel, and each of the sub-pixels comprises one of the light emitting units, wherein a light-exiting area of the light emitting unit in the green sub-pixel≥a light-exiting area of the light emitting unit in the red sub-pixel≥a light-exiting area of the light emitting unit in the blue sub-pixel.

Optionally, a distance a between an edge of an orthographic projection of a light-incoming surface of each of the wavelength converting units on the base substrate and an edge of an orthographic projection of a light-exiting surface of the light emitting unit which emits a light to be converted by the wavelength converting unit on the base substrate, and a distance b between a light-exiting surface of the OLED light emitting unit and a light-incoming surface of the backlight down conversion unit satisfies that a≤1.8b.

Optionally, the wavelength converting layer comprises a second encapsulation layer with a thickness less than 1 μm.

In another aspect, the present disclosure provides a method for manufacturing the display panel as described above, comprising:

providing a base substrate, forming a light emitting layer on a side of the base substrate, and forming a wavelength converting layer on a side of the light emitting layer away from the base substrate, wherein the light emitting layer comprises a plurality of light emitting units and a first pixel defining layer defining the plurality of light emitting units, the wavelength converting layer comprises a plurality of wavelength converting units and a second pixel defining layer defining the plurality of wavelength converting units, and each of the plurality of wavelength converting units is configured to convert a wavelength of a light emitted by at least one of the plurality of light emitting units, wherein in a direction perpendicular to the base substrate, the second pixel defining layer has a thickness twice or more that of the first pixel defining layer.

Optionally, forming a wavelength converting layer on a side of the light emitting layer away from the base substrate comprises:

forming the second pixel defining layer on a base plate, forming the wavelength converting units in a space defined by the second pixel defining layer by ink jet printing and curing an ink containing a wavelength converting material, and assembling the wavelength converting layer and the light emitting layer to the display panel with cells aligned, wherein a filling layer and a dam layer are provided between the aligned wavelength converting layer and light emitting layer.

Optionally, forming a wavelength converting layer on a side of the light emitting layer away from the base substrate comprises:

forming the second pixel defining layer on a base plate, forming the wavelength converting units in a space defined by the second pixel defining layer by applying and photoetching a photoresist containing a wavelength converting material, and assembling the wavelength converting layer and the light emitting layer to the display panel with cells aligned, wherein a filling layer and a dam layer are provided between the aligned wavelength converting layer and light emitting layer.

Optionally, the base substrate is a color film layer.

Optionally, the method further comprises:

after forming the wavelength converting units, forming a second encapsulation layer covering the second pixel defining layer and the wavelength converting units at a temperature≤180° C.

Optionally, forming a wavelength converting layer on a side of the light emitting layer away from the base substrate comprises:

forming the second pixel defining layer on the light emitting layer, and forming the wavelength converting units in a space defined by the second pixel defining layer by ink jet printing and curing an ink containing a wavelength converting material.

Optionally, forming a wavelength converting layer on a side of the light emitting layer away from the base substrate comprises:

forming the second pixel defining layer on the light emitting layer, and forming the wavelength converting units in a space defined by the second pixel defining layer by applying and photoetching a photoresist containing a wavelength converting material.

Optionally, the method further comprises:

forming a color film layer on the wavelength converting layer.

Optionally, the method further comprises:

after forming the wavelength converting units, forming a second encapsulation layer covering the second pixel defining layer and the wavelength converting units at a temperature≤100° C.

In yet another aspect, the present disclosure provides a display device comprising the display panel as described above.

DETAILED DESCRIPTION

Figure 1:
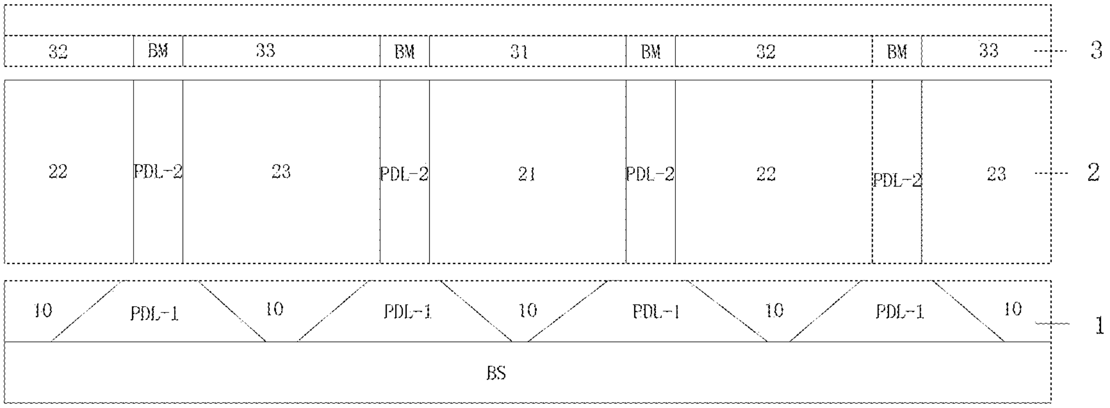
FIG. 1 schematically shows the structural principle diagram of a display device of the present disclosure.

The development of the display device comprising a wavelength converting component still faces many practical technical challenges. The inventors have found that there are many issues causing decrease in luminescence efficiency and color gamut, such as relatively low wavelength conversion rate and insufficient absorption of backlight by the wavelength converting element.

In view of the problem of decrease in luminescence efficiency and color gamut in current blue OLED-based QD-OLEDs, the inventors have carried out extensive research and surprisingly found that the light extraction efficiency of a display panel may be increased by designing a more compact light extracting structure, thereby improving the luminescence efficiency and color gamut, and improving critical optical properties. The light extracting structure may be suitable for use in QD-OLEDs, or in wavelength converting material other than QD.

In an embodiment, the present disclosure provides a display panel comprising:

a base substrate, a light emitting layer on a side of the base substrate, and a wavelength converting layer on a side of the light emitting layer away from the base substrate, wherein the light emitting layer comprises a plurality of light emitting units and a first pixel defining layer defining the plurality of light emitting units, the wavelength converting layer comprises a plurality of wavelength converting units and a second pixel defining layer defining the plurality of wavelength converting units, and each of the plurality of wavelength converting units is configured to convert a wavelength of a light emitted by at least one of the plurality of light emitting units, wherein in a direction perpendicular to the base substrate, the second pixel defining layer has a thickness twice or more that of the first pixel defining layer.

The display panel of the present disclosure may achieve higher light extraction efficiency through a specific light extracting structure.

The display panel of the present disclosure may be an OLED display panel. The OLED display panel uses an OLED as a light emitting unit. The display panel of the present disclosure may also use another type of light emitting device as a light emitting unit.

The display panel of the present disclosure is a display panel comprising a wavelength converting component. The wavelength converting component is used for converting the wavelength of a light emitted by the light emitting unit to turn the light to a light with another color. It should be noted that in the present disclosure, the wavelength conversion is different from the wavelength selective transmission. The wavelength conversion means that the wavelength of the incident light is converted to another wavelength without any additional energy, while the wavelength selective transmission means that only some wavelengths of the incident light are allowed to be transmitted, but the other wavelengths are prevented from being transmitted. The wavelength conversion may be a down-conversion or an up-conversion. The down-conversion is opposite to the up-conversion, and means that a light with a shorter wavelength is converted to a light with a longer wavelength. The color display may be achieved only with the light emitting units having one color by changing the color of a light with different wavelength converting units.

In an embodiment, the display panel of the present disclosure may be a down-conversion type OLED display panel. The down-conversion type OLED display panel uses a short wavelength OLED with one color, typically a blue OLED, as the light emitting unit. In the sub-pixels with different colors, a light with the above short wavelength is down-converted to a light with a relatively long wavelength by using different down-conversion materials (such as QDs), such that the color display is achieved base on the light emitting units with the same color. As an example, for the sub-pixels of all colors, a short wavelength blue OLED is used to emit light. In a red sub-pixel, the down-conversion material converts the blue light emitted by the blue OLED to red light. In a green sub-pixel, the down-conversion material converts the blue light emitted by the blue OLED to green light. Furthermore, because the blue color itself is one of the sub-pixel colors for the RGB display, in a blue sub-pixel, the blue light may be directly used for the display of the blue sub-pixel without down-conversion. Thus, the red, green and blue (RGB) color display is achieved. In the following discussion of the present disclosure, a blue backlight is sometimes used as a short wavelength backlight, and the down-conversion to green light and red light are illustrated as an example. However, it should be understood that an emitted light with another color or a converted light with another color may also be selected.

In the present disclosure, unless otherwise specifically indicated, for the convenience of describing the relative directions, the light-exiting side of the display panel is regarded as the "top side", and the opposite side is regarded as the "bottom side". Accordingly, the direction perpendicular to a direction from the bottom side to the top side is a "lateral direction". It should be understood that all these directions are relative directions rather than absolute directions.

The display panel of the present disclosure has a base substrate on its bottom side and a light-exiting surface of the display panel on its top side, and comprises sequentially from the bottom side to the top side: a light emitting layer; a wavelength converting layer; and optionally a color film layer.

As described above, the light emitting layer functions to emit light. The emitted light may be converted to another color through the wavelength converting layer above, or alternatively may be not converted to another color, thereby achieving the color display. A color film layer may be further provided to only allow a light with desired color in lights from the wavelength converting layer to be transmitted, thereby increasing the color purity. In the display panel of the present disclosure, the color film layer refers to a layer which selectively transmits a light with a particular wavelength.

The light emitting of the display panel of the present disclosure is achieved by light emitting units. Typically, the light emitting units are arranged in an array, in which each of the light emitting units may be an OLED, comprising a cathode, an anode and an organic light emitting layer (also referred to as an organic light emitting material portion) therebetween. Carriers provided from the cathode and the anode are recombined in the light emitting layer to emit light. In the light emitting layer, a plurality of such light emitting units are arranged in an array in parallel to the display surface of the display panel to form a light emitting matrix. Each sub-pixel of the display panel of the present disclosure may have an independent OLED, and may cooperate with an array substrate to achieve separate on and off of each sub-pixel backlight.

The light emitting layer comprises a first pixel defining layer for defining the array of the light emitting units. It should be understood that the expression "pixel defining layer" including "first pixel defining layer" described here and "second pixel defining layer" described in detail below in the present disclosure actually defines the range of each sub-pixel, such as the ranges of red, green and blue sub-pixels, rather than an overall range of a color RGB pixel.

The patterned first pixel defining layer is provided in the light emitting layer, enclosing a plurality of spaces arranged in array for disposing the light emitting units. When the light emitting unit is an OLED, the first pixel defining layer at least separate organic light emitting portions of adjacent light emitting units from each other, and may also separate other portions such the anodes of the light emitting units from each other.

The display panel of the present disclosure further comprises a wavelength converting layer on the light-exiting side of the light emitting layer, wherein the wavelength converting layer comprises an array of wavelength converting units which are configured to convert a wavelength of a light emitted by the light emitting unit.

The wavelength converting unit is used for converting the wavelength of the light emitted by the light emitting unit to a desired color in a sub-pixel. For example, a red wavelength converting unit may convert a blue backlight to a red light, and a green wavelength converting unit may convert a blue backlight to a green light. The wavelength converting unit may be a QD material portion, an inorganic phosphor powder material portion, or an organic phosphor powder material portion, and may comprise a transparent matrix material and quantum dots, inorganic phosphor powders or organic phosphor powders dispersed in the matrix material. The wavelength converting unit may also be made from another wavelength converting material. The matrix material may be a transparent organic material, such as resin, for example, cured photoresist resin, or cured ink. Any suitable down-conversion material may be used as the down-conversion material, which is not particularly limited in the present disclosure. Here, the QD down-conversion material is particularly preferred because its down-conversion performance may be controlled through the particle size. In the present application, unless otherwise specifically indicated below, QD is used as an example for illustrating the wavelength converting material.

The wavelength converting unit comprises a first color wavelength converting unit which may convert an incident light to a light with a first color. For example, the first color may be red, that is, there is a red wavelength converting unit in the wavelength converting units. It should be understood that the expression "the first color", "the second color" or the like is only intended for distinguishing colors, rather than ordering the colors. In order to achieve the color display, the wavelength converting unit may also comprise a second color wavelength converting unit, or more wavelength converting units for other colors. For example, red color may be selected as a first color, and green color may be selected as a second color. Also, for example, red color may be used as a first color, green color may be used as a second color, and blue color may be used as a third color.

Optionally, in addition to the wavelength converting units, the wavelength converting layer may also comprise a transparent unit. The transparent unit is transparent to an incident light, and no wavelength conversion occurs therein. As such, for example, the light emitted by the blue OLED in a blue sub-pixel may pass through wavelength converting layer, but may be directly used for displaying blue color without wavelength conversion. Preferably, the transparent unit may be a light diffusing unit, for example, comprising scattering particles, such that an incident light is scattered without change in wavelength, which facilitates uniform display. The light diffusing unit may be prepared from a light diffusing resin having a capability of light diffusing, such that a blue light becomes more uniform after passing through it. In the present disclosure, the expression "transparent" means that a light is allowed to be transmitted with change in angle but without any wavelength conversion.

The wavelength converting layer comprises a second pixel defining layer defining the wavelength converting units. When there is a transparent unit, the second pixel defining layer also defines the transparent unit. The patterned second pixel defining layer at least encloses a plurality of spaces arranged in an array to be filled with the wavelength converting material portions or the transparent material. The second pixel defining layer at least separates a wavelength converting unit from a neighboring wavelength converting unit or the transparent unit. In different subpixels, the light emitting unit is cooperated with the first color wavelength converting units, the second color wavelength converting units, the transparent unit and the like defined by the second pixel defining layer respectively.

In a direction away from the base substrate, the plurality of light emitting units may comprise an anode, a light emitting layer, and a cathode in this order, wherein a distance between a surface of the cathode away from the base substrate and a surface of the wavelength converting unit close to the base substrate is less than the thickness of the second pixel defining layer, and is greater than the thickness of the first pixel defining layer. In the case where the wavelength converting unit comprises quantum dots, the surface of the wavelength converting unit close to the base substrate refers to the surface of the quantum dots close to the base substrate. The advantage of such a configuration is that the cell thickness may be reduced, thereby avoiding cross color.

The display panel of the present disclosure may further comprise a color film layer. The color film layer is disposed on the top side of the wavelength converting layer, and comprises color film units. The color film units are used for filtering light, that is, allowing a portion of lights coming from the wavelength converting layer within a wavelength range to be transmitted, thereby further increasing the color purity. The color film units comprises a color film unit for a first color, and may also comprise a color film unit for a second color, or more color film units for other colors. For example, in the case where a light is emitted by a blue OLED, a red color film unit may be provided on the light-exiting side of the red wavelength converting layer, a green color film unit may be provided on the light-exiting side of the green wavelength converting layer, and a blue color film unit may be provided on the light-exiting side of the transparent unit. The color film may be prepared from a common material for color film in the field of display.

Preferably, the color film layer comprises a black matrix defining the color film units. Preferably, a projection of the black matrix in the wavelength converting layer is within the top surface of the second pixel defining layer. In other words, the black matrix is not positioned above the light-exiting surface of the wavelength converting unit or the backlight scattering unit defined by the second pixel defining layer, and will not block the emitted light. That is, the area of the projection of the color film unit in the wavelength converting layer is greater than the area of the top surface of the wavelength converting unit or the backlight scattering unit. As such, the light non-vertically output from the top surface of the wavelength converting unit or the backlight scattering unit may be sufficiently utilized, thereby increasing the luminescence efficiency. The black matrix may also be formed from a conventional material for black matrix in the art.

In the present disclosure, in a direction perpendicular to the base substrate, the second pixel defining layer has a thickness twice or more that of the first pixel defining layer. The inventors have found that when the second pixel defining layer has a thickness much greater than that of the first pixel defining layer, for example, being twice or more greater, the wavelength converting unit may sufficiently achieve the wavelength conversion of the light emitted by the light emitting unit. This facilitates further design of a more compact light extracting structure, and increases the light extraction efficiency of the device, thereby improving the luminescence efficiency and color gamut and improving critical optical properties. The thickness of the second pixel defining layer may be twice, 2.5 times, 3 times, 4 times, or 5 times greater than that of the first pixel defining layer. When a ratio of the thickness of the second pixel defining layer to the thickness of the first pixel defining layer is too low, it is difficult to sufficiently achieve the wavelength conversion of the light emitted by the light emitting unit. This is inconvenient to further design a structure for increasing the light extraction efficiency. It should be noted that in the present disclosure, the thickness direction of a layer is the direction perpendicular to the base substrate, i.e. the height direction of the wall of the pixel defining layer.

Preferably, the first pixel defining layer may have a thickness in a range from 1 to 2 μm, and the second pixel defining layer may have a thickness in a range from 6 to 20 μm in a different design. Preferred thickness ranges for cooperated first pixel defining layer and second pixel defining layer may take into consideration both the guarantee of the optical effect of the wavelength conversion and practical process capability, which not only well achieves the optical effect of the wavelength conversion, but also does not increase the difficulty in preparation significantly. The above preferred ranges may achieve a display panel with compact structure and high light extraction efficiency. The first pixel defining layer and the second pixel defining layer in the present disclosure not only function to define the areas of the light emitting units, the wavelength converting units and the transparent unit, but also may participate in reflection and absorption of light. They may function to improve light propagation and conversion properties and increase the light extraction efficiency in the display panel when they are properly cooperated with each other. Furthermore, the shapes of the first and second pixel defining layers also have positive effect on the preparation process during the processes of forming the light emitting units, the wavelength converting units and the backlight scattering unit. For example, as described below, for different processes of forming the wavelength converting units and the backlight scattering unit, the present disclosure proposes several particular structures for the second pixel defining layer. When the second pixel defining layer has a thickness less than 6 μm, the wavelength converting layer may have insufficient conversion efficiency, and may also have increased reflectivity for blue light but decreased reflectivity for yellow light, which is detrimental to increasing the luminescence performance of the display panel. When the thickness of the wavelength converting unit is increased, the conversion efficiency may be increased, but the light transmittance is decreased thereby. When the second pixel defining layer has a thickness greater than 20 μm, excessively thick wavelength converting unit is formed, and the overall conversion efficiency will be decreased. Therefore, a thickness in a range from 6 to 20 μm may ensure an acceptable low value of wavelength conversion efficiency.

In the present disclosure, the area of the light-incoming surface of the wavelength converting unit may be greater than the area of the light-exiting surface of the light emitting unit. The area of the light-incoming surface of the wavelength converting unit refers to the area of the surface thereof towards the base substrate, which may receive light in its interior. The area of the light-exiting surface of the light emitting unit refers to the area of the opening defined by the first pixel defining layer, and is an area of a planar surface which may output light to its outside. In other words, in each sub-pixel of the display panel, the light-exiting surface of the light emitting unit is within an orthographic projection of the light-incoming surface of the wavelength converting unit in the light emitting layer. Thus, the light non-vertically output from the top surface of the light emitting unit may be sufficiently utilized, thereby increasing the luminescence efficiency. Depending on the differences in the optical path and the preparation process due to the structure, a ratio between the above two areas may vary. Generally, the cell alignment device structure has relatively larger area of the wavelength converting unit than the on-EL device structure, so as to avoid light leakage between pixels.

Furthermore, in the present disclosure, a projection of the second pixel defining layer in the light emitting layer is within the top surface of the first pixel defining layer. In other words, the second pixel defining layer is not positioned above the light-exiting surface of the light emitting unit defined by the first pixel defining layer, and will not block the emitted light. More preferably, the area of the projection of the second pixel defining layer in the light emitting layer is less than the area of the top surface of the first pixel defining layer.

In the present disclosure, the material for the first pixel defining layer may be different from the material for the second pixel defining layer. The transmittance to visible light of the first pixel defining layer may be higher than that of the second pixel defining layer.

FIG. 1 schematically shows the structural principle diagram of a display panel of the present disclosure. The display panel of the present disclosure comprises a light emitting layer 1, a wavelength converting layer 2 and optionally a color film layer 3. In FIG. 1, they are drawn separately to show the relationship therebetween. Nevertheless, in a practical display panel, they may be combined with each other. For example, the wavelength converting layer 2 may be in direct contact with the light emitting layer 1, and the wavelength converting layer 2 may also be in direct contact with the color film layer 3.

The light emitting layer 1 comprises a first pixel defining layer PDL-1, which defines an array of light emitting units 10. All the light emitting units 10 may be short wavelength light emitting units, such as blue light OLED light emitting units. These light emitting units may be driven by, for example, an array substrate S. In the present disclosure, each of the light emitting units emits light for one sub-pixel.

Light emitted upwards by the light emitting units 10 of the light emitting layer 1 is incident on the bottom surface of the wavelength converting layer 2. The wavelength converting layer 2 comprises a second pixel defining layer PDL-2, and first color wavelength converting units 21, second color wavelength converting units 22 and a transparent unit 23 defined thereby. For example, the first color wavelength converting units 21 may be green wavelength converting units, the second color wavelength converting units 22 may be red wavelength converting units, and the transparent unit 23 is used for transmitting light without conversion and may be a light diffusing unit. As such, after the light incident on the bottom surface of the wavelength converting layer 2 passes through the wavelength converting layer 2, its color changes in at least a portion of the sub-pixel, thereby achieving RGB display for example.

The wavelength converting materials used in the first and second color wavelength converting units may be QD, another material having a function of down-conversion such as an inorganic fluorescent powder and an organic fluorescent material, or another material having a function of up-conversion. It should be noted that in the present disclosure, although the QD down-conversion layer is used for illustration sometimes, the scope of the present disclosure is not limited to the QD down-conversion layer.

The light exiting the wavelength converting layer 2 then enters into corresponding sub-pixel color films in the color film layer, such as a color film for a first color 31, a color film for a second color 32 and a color film for a third color 33, so that the color purity is further improved, thereby achieving the final color display. A black matrix BM may be provided between the color film units to avoid cross color. A substrate may be further provided on the top portion of the color film layer, and it may also be an external encapsulation layer or a cover plate.

The light-incoming surface of the wavelength converting unit may be greater than the light-exiting surface of the light emitting unit. Furthermore, the thickness of the PDL-2 may be twice or more greater than that of the PDL-1. Such a thickness allow the light emitted by the OLED unit to have sufficient space for the wavelength conversion and processes of scattering, reflection and the like in the wavelength converting unit, which is beneficial for finally obtaining a high quality and uniform luminescence.

FIG. 1 only shows the fundamental principle and structure of the display panel of the present disclosure. In addition to the light emitting layer, the wavelength converting layer and the color film layer, optionally, the display panel of the present disclosure may further comprise a filling layer and supporting pillars between the light emitting layer and the wavelength converting layer, as well as a structure such as a dam layer enclosing the filling layer on the periphery of the display panel. Furthermore, for the light emitting units and the wavelength converting units/the transparent unit, an encapsulation layer may be further provided. Also, a polarizer, an optical compensator or the like may be further provided in the display panel. FIG. 1 is only intended to illustrate the position relationship between various components, but not to limit particular shapes and details of them.

It should be noted that all the drawings in the present disclosure are schematic diagrams and particular angles, lengths and the like therein will not limit the present disclosure, unless specifically indicated otherwise.

Typically, in the light emitting layer, a drive control unit is provided for each light emitting unit. The drive control unit may be a thin film transistor (TFT), and thus the light emitting layer may be composed of a TFT array substrate and an array of light emitting units connected to the array substrate. In other words, the light emitting layer may further comprise a TFT array substrate on the bottom side of the first pixel defining layer.

The TFT array substrate may be a conventional array substrate in the art. More specifically, an Oxide TFT or a low temperature polysilicon (LTPS) substrate may be used as the TFT array substrate. The TFT array substrate may comprise a first base substrate and TFTs arrange in an array on the first base substrate, and the source/drain electrodes of the TFT are electrically connected to a pixel electrode such as an anode of the light emitting unit. Preferably, the pixel electrode connected to the TFT at the bottom of the light emitting unit may be a reflecting anode. The reflecting anode device structure is used in the light emitting unit to form a top-emitting OLED. The reflecting anode is used for reflecting the emitted light towards the non-light-exiting side to the light-exiting side, thereby increasing the luminescence efficiency.

Figure 2:
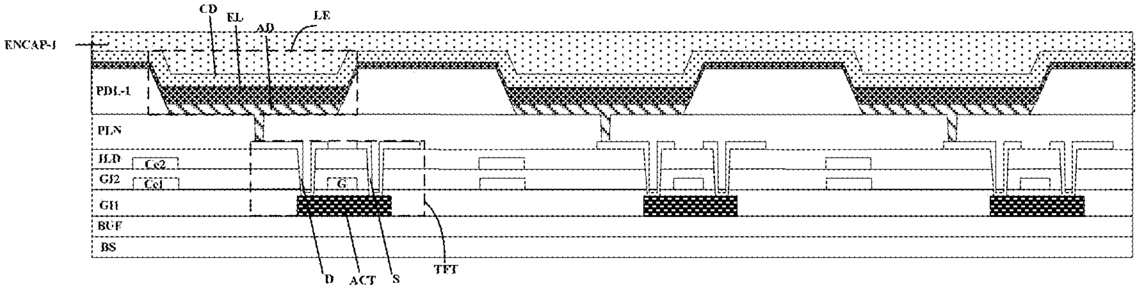
FIG. 2 shows an embodiment of an OLED light emitting layer.

FIG. 2 shows an embodiment of the light emitting layer 1. The figure shows a partial schematic diagram of a structure comprising 3 complete OLED light emitting units and 4 PDL-1*s*. A buffer layer BUF is provided on the base substrate BS. On the buffer layer, each sub-pixel is provided with a TFT unit. The TFT unit comprises a source electrode S, a drain electrode D, a gate electrode G, and an active layer ACT. A first gate electrode insulating layer GI1 is provided below the gate electrode and between the gate electrode and the active layer, and a second gate electrode insulating layer GI2 is overlaid on the gate electrode and its periphery. An interlayer dielectric layer ILD and a planarization layer PLN are provided in sequence on the second gate electrode insulating layer. Enable signal wires Ce1 and Ce2 are further provided on the second insulating layer and the interlayer dielectric layer. A light emitting unit LE is formed on the planarization layer between the first pixel defining layers PDL-1. The light emitting unit LE comprises an anode AD, an organic light emitting portion EL and a cathode CD from bottom side to top side. The anode is connected to the drain electrode of the TFT, and the cathode is a common electrode. A first encapsulation layer Encap-1 is further provided on the cathode. The first encapsulation layer is disposed on a side of the light emitting layer close to the wavelength converting layer. FIG. 2 schematically shows that the PDL-1*s* are walls having a trapezoidal vertical section. It should be understood that it forms a network on the array substrate, and define a plurality of spaces for accommodating the light emitting units. The structure of the OLED light emitting unit as described above is known in the art, and comprises an anode, an organic light emitting layer, a cathode, and so on. In FIG. 2, the anode AD of the light emitting unit may be a reflecting anode which reflects the light emitted by the OLED towards the light-exiting surface to increase the light output efficiency. Furthermore, in contrast to the multi-color OLED array, the light emitting layer of the present disclosure only has a light emitting material layer with one color, and thus may be formed on the entire surface with an open mask without forming the sub-pixels one by one by using a fine metal mask, for example.

A projection of the TFT on the base substrate may be overlapped with both the PDL-1 and the light emitting unit. That is, one portion of the TFT may also be positioned below the PDL-1, and another portion may be positioned below the reflecting anode.

As shown in FIG. 2, a first encapsulation layer Encap-1 may be further provided on the top side of the light emitting layer. The first encapsulation layer is substantially transparent to the light emitted by the light emitting unit, functions to encapsulate the OLED unit, and may planarize the top surface of the light emitting layer. A short pass (short wavelength pass) structure may be provided in the first encapsulation layer. The short pass structure may have a reflection to red light and green light stronger than a reflection to blue light, functioning to increase the transmission of the light emitted by the blue light emitting unit and reflect the red light and green light obtained by conversion.

Typically, Encap-1 has a thickness less than 10 μm. The thickness of Encap-1 is related to the pixel design and the resolution. The higher the resolution, and the smaller the pixel design, the smaller the thickness of the encapsulation film layer is required. The main cause is that in the light output direction, the light emitted from the light emitting unit will pass through Encap-1 to the surface of the wavelength converting unit. When there is a material with relatively low refractive index in Encap-1, the light will be gradually diffused to the surroundings due to low refractive index of the material. An example of the material with relatively low refractive index may be an organic planarization layer in the Encap-1 layer, which may have a thickness of about 4-8 μm and may account for a majority of the thickness of Encap-1. As the thickness of the encapsulation layer increases, the light emitted by the light emitting unit is reflected further to the surroundings through the encapsulation layer, and finally, may influence a neighboring sub-pixel, resulting in unnecessary light leakage. With the increase in resolution, the number of pixels per unit area will increase, thereby raising a higher requirement for the limitation on the light leakage due to light diffusing. Therefore, when the resolution is higher and the pixel is smaller, smaller thickness of the encapsulation film layer is needed. A preferred thickness is ≤6 μm. In view of the requirement on the encapsulation performance, the thickness of the encapsulation layer is not less than 1 μm.

Encap-1 may be a monolayer inorganic layer, or a stack structure of a plurality of sub-layers, such as a stack of a first inorganic layer/an organic layer/a second inorganic layer, and a stack of a first inorganic layer/a second inorganic layer. Preferably, a stack of a first inorganic layer/an organic layer/a second inorganic layer from bottom to top or a stack of a first inorganic layer/a second inorganic layer from bottom to top is used as Encap-1, and a short pass structure may be further provided therein. In an embodiment of the short pass structure, at least one of the first inorganic layer and the second inorganic layer is composed of multiple layers of inorganic films, and at least some inorganic films in the multiple layers of inorganic films optically tend to reflect yellow light more easily. The short pass structure may have a function of optical adjustment. It has a higher transmittance to the blue light emitted by the light emitting unit below, but reflects more red/green light produced by the wavelength converting units above, thereby increasing the overall optical utilization of the display panel. In the present disclosure, the first encapsulation layer may be a first inorganic layer containing a short pass structure and a second inorganic layer thereon; a first inorganic layer and a second inorganic layer containing a short pass structure thereon; a first inorganic layer containing a short pass structure, and an organic planarization layer and a second inorganic layer thereon; a first inorganic layer, and an organic planarization layer and a second inorganic layer containing a short pass structure thereon; or the like. For the on-EL process as described below, the first encapsulation layer containing an organic planarization layer is more preferable.

Briefly, the first encapsulation layer may comprise a first inorganic layer and a second inorganic layer on a side of the first inorganic layer away from the light emitting layer, wherein the second inorganic layer comprises a stack of a plurality of inorganic sub-layers, which has a reflectivity for a light with a wavelength converted by the wavelength converting unit greater than a reflectivity for a light emitted by the light emitting unit, and has a transmittance for a light emitted by the light emitting unit greater than a transmittance for a light with a wavelength converted by the wavelength converting unit.

The short pass structure may be prepared by a semiconductor process. For example, a three-layer inorganic film structure of SiOx/TiO2/SiOx with a total thickness in a range from 100 to 700 nm, preferably from 170 to 350 nm is used as the short pass structure in an inorganic layer. Also, an inorganic film structure comprising more alternately stacked SiOx/TiO2, for example, SiOx/TiO2/SiOx/TiO2, SiOx/TiO2/SiOx/TiO2/SiOx, or the like, may be used as the short pass structure. Preferably, the first inorganic layer and the second inorganic layer containing the short pass structure thereon, or the first inorganic layer and the organic planarization layer and the second inorganic layer containing the short pass structure thereon, is used. That is, the short pass structure is formed in the second inorganic layer on the top side. As such, the first inorganic layer below the short pass structure and the optional organic layer may be utilized to maintain the distance from the short pass structure to the OLED device, thereby alleviating possible degradation effect of local high temperature on the OLED device when forming the short pass structure by a semiconductor thin film deposition process.

Figure 3:
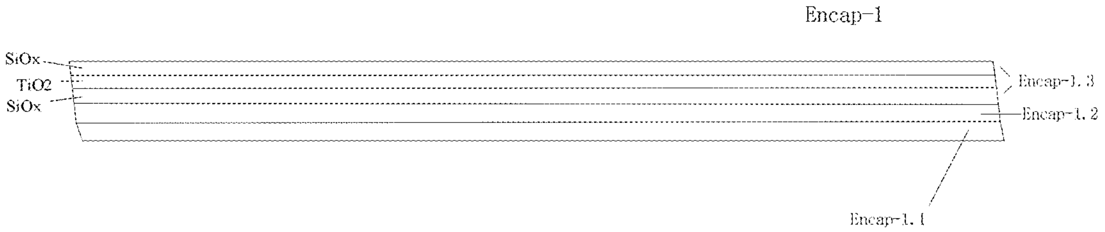
FIG. 3 shows an exemplary film layer structure of a first encapsulation layer.

FIG. 3 shows an exemplary stack structure of film layers in Encap-1 of FIG. 2. It comprises a first inorganic layer Encap-1.1, an organic layer Encap-1.2, and a second inorganic layer Encap-1.3, and the second inorganic layer comprises a short pass structure formed from three layers of inorganic films, SiOx/TiO2/SiOx. Preferably, the second inorganic layer is relatively further away from the bottom side, such that the local high temperature during its preparation has less effect on the light emitting unit on the bottom side.

Returning back to FIG. 2, in the section perpendicular to the display surface, the first pixel defining layer PDL-1 comprises walls with a thickness and a width on both sides of the organic light emitting material portion in the light emitting unit. Typically, the wall has a normal trapezoid shape. That is, it has a top edge, a bottom edge and symmetrical lateral edges, wherein the bottom edge is longer than the top edge. Such normal trapezoid walls are beneficial for forming an inverse trapezoid organic light emitting material portion between two walls, such that the emitted light can be output sufficiently, thereby improving the luminescence efficiency. Furthermore, such normal trapezoid walls are also beneficial for utilizing a process of depositing various film layers of the OLED unit therein.

In the present disclosure, the expression "trapezoid" comprises normal trapezoid, inverse trapezoid, and rectangle, wherein the bottom edge is shorter than the top edge in the inverse trapezoid, and the bottom edge is equal to the top edge in the rectangle. The shape of the trapezoid may be characterized by the angle formed between the bottom edge and the lateral edge. Herein, the angle between the bottom edge and the lateral edge refers to the interior angle of the trapezoid.

The trapezoid shape is desirable from the viewpoint of easy characterization, but will not be easily achieved in the process. The inventors of the present disclosure have found that the practically formed pixel defining layer typically does not has a standard trapezoid shape, and sometimes even has a shape significantly different from a standard trapezoid. The inventors have found that the cross sectional shape of the pixel defining layer may be characterized by a special quadrilateral. In the present disclosure, such a quadrilateral is referred to as a characteristic quadrilateral. The inventors have further found that when the characteristic quadrilateral of the cross sectional shape of the pixel defining layer meets certain requirements, it is helpful for further optimizing the light extracting structure of the present disclosure. Here, the pixel defining layer comprises both the first pixel defining layer PDL-1 and the second pixel defining layer PDL-2.

The method of drawing the characteristic quadrilateral is as follows. First, a free edge of the cross sectional shape of the pixel defining layer is identified. The pixel defining layer is necessarily formed on a base plate, and an edge thereof which are not in contact with the base plate is its free edge. A point in the free edge of the pixel defining layer furthest away from the base plate is found out, and a line segment passing through the point and parallel to the base substrate of the display panel is drawn, which is referred to as the first edge. Subsequently, two ends of the non-free edge (the boundary between the pixel defining layer and the base plate) of the pixel defining layer are connected to form a line segment, which is referred to as the second edge. Line segments extending from those two ends to the first edge and tangential to the cross sectional shape are drawn, and considered as the third edges and fourth edges. The quadrilateral enclosed by those four edges is the characteristic quadrilateral.

Figure 20:
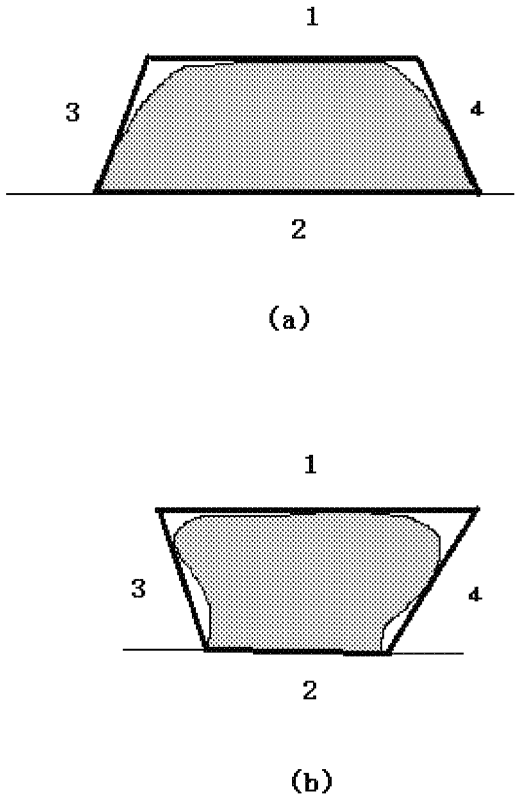
FIGS. 20(*a*) and (*b*) schematically show characteristic quadrilaterals of the pixel defining layer.

As shown in FIGS. 20(*a*) and (*b*), characteristic quadrilaterals enclosed by the first to fourth edges 1-4 are drawn for different cross sectional shapes of the pixel defining layer. The characteristic quadrilateral may be non-trapezoid, but trapezoid is preferable.

For simplicity, in the present disclosure, trapezoid is substantially used as an example for describing the cross sectional shape of the pixel defining layer hereinafter. However, it should be understood that the description and definition with respect to trapezoid may be expanded to the characteristic quadrilateral.

In the characteristic quadrilateral of the section of PDL-1, because it is formed on a side of the base plate the same as the base substrate, a side thereof away from the base substrate is the first edge of its characteristic quadrilateral. Preferably, each of the angle between the second edge and the third edge and the angle between the second edge and the fourth edge thereof is in a range from 20° to 60°, and more preferably from 20° to 40°. Preferably, normal trapezoid is used, and the angle between the lateral edge and the bottom edge is in a range from 20° to 60°, and more preferably from 20° to 40°. Furthermore, as described above, PDL-1 preferably has a height in a range from 1 to 2 μm. The opening formed with such trapezoid section and thickness is particularly convenient for forming various film layers of the light emitting unit, particularly the OLED light emitting unit by a deposition process, and is beneficial for sufficiently utilizing the light emitted by the light emitting unit. The inventors have surprisingly found that the shape of PDL-1 will influence the electrical connection or lapping performance of the cathode in the light emitting unit, and an efficient blue OLED device has higher requirements on the lapping of the cathode. Lapping refers to the layout of the cathode along the lateral wall and top portion of PDL-1. Typically, the cathode such as a thin metal layer with a thickness of about 15 nm may be formed with an open mask by an evaporation process, and is deposited on the lateral surface and the top surface of PDL-1. When the section of PDL-1 is normal trapezoid and the angle between the lateral edge and the bottom edge is within the above preferred range, it is beneficial for achieving good lapping of the cathode of the light emitting unit in the present disclosure. If the above angle is too large, the lateral wall of PDL-1 will be relatively steep, such that poor lapping occurs easily when laying the cathode, influencing the device effect. Furthermore, the above preferred angle is also beneficial for preparing small size OLED display panel. Therefore, the above shape of PDL-1 is beneficial for increasing the efficiency of the light emitting unit, thereby improving the luminescence and display effect.

PDL-1 may be colored or transparent. Preferably, PDL-1 is colored, and more preferably black. Colored, particularly black PDL-1 is helpful for shielding the crosstalk between adjacent sub-pixels due to transverse light propagation. In consideration of the luminance, the light emitting area of the light emitting unit defined by PDL-1 in the sub-pixels satisfies that G≥R≥B. That is, the light emitting area of the light emitting unit in the green sub-pixel≥the light emitting area of the light emitting unit in the red sub-pixel≥the light emitting area of the light emitting unit in the blue sub-pixel. This is because human eyes are most sensitive to green light, less sensitive to red light, and further less sensitive to blue light. Therefore, the green sub-pixel is designed to have relatively large area, such that the luminance which can be perceived by human eyes may be effectively increased. In addition, from the viewpoint of the cooperation effect between the wavelength conversion capability and the color film layer as described below, relatively large area of the light emitting unit in the green sub-pixel is preferred, because available green light emitting energy is lower than available red light emitting energy. Nevertheless, for simplicity, equivalent light emitting areas are shown in FIG. 2.

The width of the wall of PDL-1 may be designed depending on the designed resolution and the aperture ratio of the display panel. A rigid glass or plastic substrate material may be used for the base substrate. PDL-1 may be formed on a TFT substrate with the material and preparation process for pixel defining layer commonly used in the OLED device.

After PDL-1 is formed on the TFT substrate, a reflecting anode electrically connected to the TFT is formed at the bottom of the space defined by PDL-1. Then, subsequent film layers of the OLED light emitting unit may be deposited with an open mask, including but not limited to an organic light emitting material layer, a translucent cathode layer, a light extracting layer and the like. Because it is not necessary to use a fine metal mask, the process is more economical.

The light emitting unit preferably emits a blue light, and more preferably a light with a central wavelength in a range from 420 to 470 nm and a half peak width in a range from 10 to 30 nm.

For different processes of forming the display panel, the present disclosure proposes several particular structures for the second pixel defining layer and the wavelength converting unit. The process for forming a display panel may comprise a cell alignment process and an on-EL process. The cell alignment process refers to a process where the light emitting layer and the wavelength converting layer are formed separately, and then they are assembled with cells aligned. The on-EL process is to prepare the wavelength converting layer on the light emitting layer by layer. Furthermore, the processes for preparing the wavelength converting unit/the backlight diffusing unit may comprise an ink jet printing process and a photolithographic process. By combining the above techniques respectively, the following four modes may be achieved: a combination of ink jet printed wavelength converting layer and cell alignment assembling, a combination of photoetched wavelength converting layer and cell alignment assembling, a combination of on-EL and ink jet printed wavelength converting layer, and a combination of on-EL and photoetched wavelength converting layer. In the present disclosure, more preferable device structures are provided for the above four modes.

In all the modes, it is necessary to form a light emitting layer first. In the cell alignment mode, the light emitting layer is cell aligned with the integral wavelength converting layer; while in the on-EL mode, the wavelength converting layer is formed on the light emitting layer by layer.

The wavelength converting layer of the present disclosure will be described below with reference to particular modes.

Mode I: Forming the Wavelength Converting Layer by Ink Jet Printing and Assembling with Cells Aligned In the present disclosure, in Mode I, a wavelength converting layer is formed by ink jet printing separately from the light emitting layer, and then the wavelength converting layer is assembled with the light emitting layer with cells aligned.

In Mode I, the wavelength converting layer is formed on a base plate separated from the light emitting layer. With the wavelength converting units or the optional transparent unit of the sub-pixels in the wavelength converting layer aligned with the light emitting units, the light emitting layer is assembled together with the wavelength converting layer to form a display panel. In order to form the display panel with cells aligned, typically, it is necessary to provide a filling layer and supporting pillars in the center of the display panel and a dam layer on the periphery, between the light emitting layer and the wavelength converting layer.

In the cell alignment mode, the wavelength converting layer is preferably directly formed on a color film layer. That is, the color film layer serves as a base plate for the wavelength converting layer. In this way, it may be not necessary to provide an additional base plate to form the wavelength converting layer, such that the wavelength converting unit is in direct contact with the color film, which both simplifies the process and material and increases the luminescence efficiency. Such a combination may also be referred to as a wavelength converting color film substrate. When quantum dots are used as the down-conversion material, it may be referred to as a quantum dot color film substrate.

Figure 4:
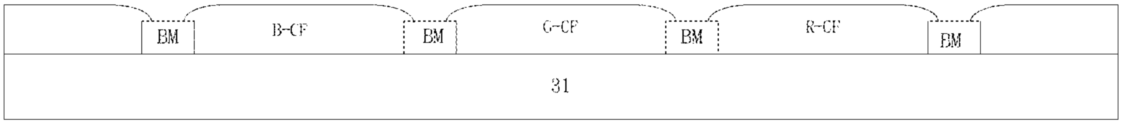
FIG. 4 shows a schematic diagram of a color film layer which serves as a base plate in a cell alignment mode.

FIG. 4 shows a schematic diagram of a color film layer which serves as a base plate. The color film layer 3 has a transparent substrate 31, and a black matrix BM for blocking light thereon. Desired color film units, such as blue, green and red color film units B-CF, G-CF, R-CF, are formed between the black matrixes.

BM/B-CF/R-CF/G-CF may be sequentially prepared on the transparent substrate 31 according to a conventional process, and preferably, the thickness of BM≤2 μm, and the thickness of R/G/B CF≤3 μm. Because the color film unit is slightly thicker than BM, in general, CF will partially overlap and cover the BM. This may ensure that there is no gap to leak light between the BM and the color film unit. Specifically, the edge of the color film may lap the top portion of the BM in the form of an inclined curved surface.

For the spectrum selection of the color film unit corresponding to the wavelength converting unit, in principle, the transmittance spectrum needs to be in good match with the spectrum of the wavelength converting material such as QD after being excited by B-OLED. In brief, R-CF/G-CF needs to well filter the blue light which is not absorbed by the wavelength converting material, and also needs to cover the range of excited peaks from down-conversion.

With the color film layer as a substrate, the wavelength converting layer may be formed, and the wavelength converting color film substrate thus obtained is then assembled with the light emitting layer with cells aligned to produce a display panel.

Figure 5:
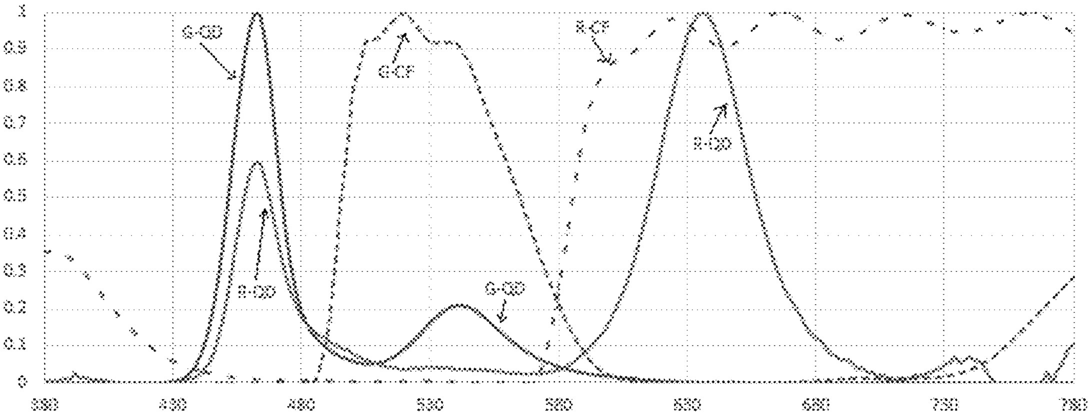
FIG. 5 shows the cooperation of the color filtering property of a color film unit and the luminescence property of a wavelength converting unit.

The light filtering property of the color film units in the color film layer is appropriately selected, so as to be well cooperated with the converted light from the wavelength converting unit. FIG. 5 shows an example of the cooperation of the color filtering property of a color film unit and the luminescence property of a wavelength converting unit. The ordinate in the figure is the transmittance for the color film unit, and is the spectral energy after excitation for the wavelength converting unit, and the abscissa is the wavelength. In the figure, the dark solid curve G-QD represents the spectral energy for the green wavelength converting layer, the light solid curve R-QD represents the spectral energy for the red wavelength converting layer, the dense dashed curve G-CF represents the transmittance for the green color film unit, and the sparse dashed curve R-CF represents the transmittance for the red color film unit. As seen from the figure, all lights with a wavelength of 480 nm or less are filtered by the color films. The green color film allows converted green light with a wavelength around 540 nm to be transmitted, while the red color film allows converted red light with a wavelength around 640 nm to be transmitted. Thus, under the irradiation of a blue light, the wavelength converting color film substrate may display red light and green light well. As shown in the figure, the green wavelength converting unit has a low light emitting energy in the transmitted wavelength range of the green color film. As described hereinbefore, in order to ensure suitable luminance, the green sub-pixel may have the largest area, while the blue sub-pixel may have the smallest area because there is no down-conversion loss.

Unless specifically indicated otherwise, the above description of the color films is applicable to both Mode I and Modes II-IV.

A second pixel defining layer PDL-2 is formed on the color film layer, and defines the space for the wavelength converting units or the transparent unit. Then, the wavelength converting units or the transparent unit is formed in the space enclosed by the walls of PDL-2.

The second pixel defining layer PDL-2 may be directly formed on BM, and serves as a bank layer for forming the wavelength converting units by ink jet printing in this mode. In the process of forming the wavelength converting unit by ink jet printing, an ink containing a wavelength converting material is used. The ink is printed into the space between the banks, and then the ink layer is cured (for example, photocured) to form the wavelength converting unit. The process of ink jet printing QD for example is known. The color film layer may also have a protection layer covering the black matrix and/or the color film units, and PDL-2 and the wavelength converting units are formed on the protection layer.

In order to be advantageously used in ink jet printing, the bank layer needs to have a lyophobic surface, including the lateral surfaces and the top surface, so as to reduce the climbing of the ink along the wall sides. Relative to the lateral surfaces, there is higher requirement on lyophobicity for the top surface. Preferably, PDL-2 is entirely prepared from a lyophobic material. Examples of the raw material of the lyophobic material may comprise a mixture of an acrylate polymer and a polyfunctional monomer, a mixture of a siloxane polymer and an acrylic monomer, and the like. The lyophobicity may be characterized by contact angle.

In the characteristic quadrilateral of the section of the bank layer, because it is formed on a side of the base plate opposite to the base substrate side, a side thereof close to the base substrate is the first edge of its characteristic quadrilateral. Preferably, each of the angle between the second edge and the third edge and the angle between the second edge and the fourth edge thereof is in a range from 80° to 140°, and more preferably from 95° to 120°. Accordingly, each of the angle between the first edge and the third edge and the angle between the first edge and the fourth edge thereof is in a range from 40° to 100°, and preferably from 60° to 85°. The section may be a trapezoid (including rectangle), and when the side of the color film layer is considered as the bottom edge of the trapezoid, the angle between the lateral edge and the bottom edge is in a range from 80° to 140°, and preferably from 95° to 120°. Accordingly, if the light emitting layer after cell alignment is used as the bottom side, then the angle between the lateral edge and the bottom edge of the section of the bank layer is in a range from 40° to 100°, and preferably from 60° to 85°. For the bank layer, when the shape is within the preferred angle range, the wavelength converting units formed by ink jet printing and defined thereby have high optical energy utilization. Outside of this angle range, the light energy loss increases. It should be noted that this preferred range takes into consideration not only the optical properties, but also the difficulty of the process to achieve the bank layer with such an angle.

Within the preferred angle range, the bank layer on the color film layer is actually an “inverse trapezoid”.

Figure 6:
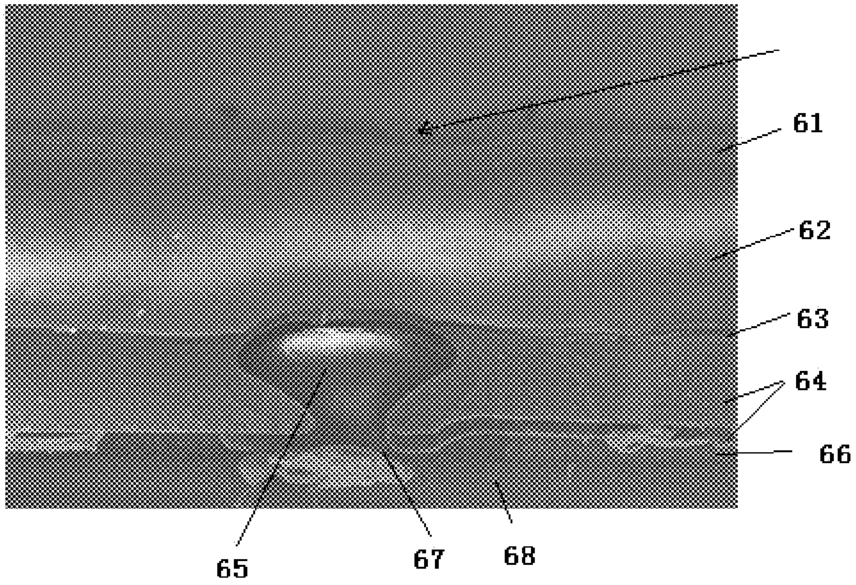
FIGS. 6(*a*)-(*b*) show a micrograph and a schematic diagram of the mushroom-shaped section for the structure of a down conversion color film substrate ink jet printed in a cell alignment mode in an embodiment of the present disclosure.
Figure 6:
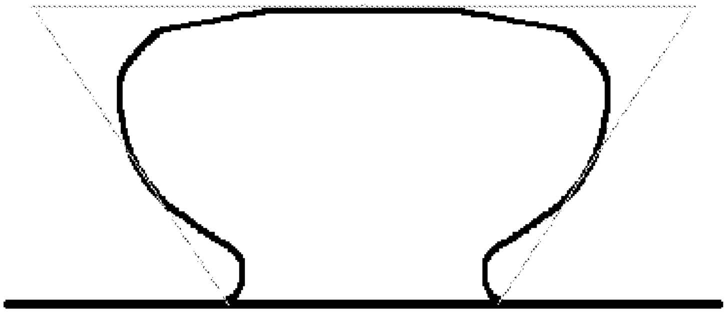

Although it is desirable to form a trapezoid section, in a practically manufactured product, the shape of the section often has some variations from a standard trapezoid due to the limitations of the material and process for the bank layer. The top angles of an inverse trapezoid are usually not sharp angles, but rounded angles, or even a “mushroom-shaped” section is formed in practical production, as shown in FIG. 6(*a*). FIG. 6(*a*) shows a micrograph for the structure of a wavelength converting color film substrate ink jet printed in the cell alignment mode in an embodiment of the present disclosure. The graph shows a bank layer, wavelength converting units on both sides of the bank layer, and an encapsulation layer, a filling layer and the like on the bank layer and the wavelength converting units. Specifically, FIG. 6(*a*) shows a part of an “inverse” display panel (with the color film layer on the lower side). 61 is a part of the Encap-1 layer. The OLED units and the first pixel defining layer thereon have been peeled off to prepare the SEM sample, and the shallow recess indicated by the arrow is the position where the first pixel defining layer is with cells aligned. 62 is a filling layer, 63 is a second encapsulation layer Encap-2, 64 is a wavelength converting unit, 65 is a PDL-2 layer (i.e. a bank layer), 66 is a color film unit, 67 is a black matrix, and 68 is a substrate. The cause of the delamination of the wavelength converting unit on the right side of the figure is the difference in curing efficiency due to the process. The schematic diagram of the mushroom-shaped section may be as shown in FIG. 6(*b*), where two top angles thereof are rounded, and the undercut depth at the base may be reduced. In the present disclosure, an inverse trapezoid tangential to the mushroom-shaped section is used to represent it. The top edge of the tangential inverse trapezoid is flush with the highest portion of the mushroom-shaped section, and the bottom edge is the base of the mushroom-shaped section. In FIG. 6(*b*), the grey lines show the trapezoid representing the mushroom-shaped section. Therefore, the inverse trapezoid design range of the present disclosure also includes the mushroom-shaped bank layer represented by such a trapezoid. It should be noted that if allowed in the process, the variation of the product from trapezoid should be avoided as much as possible, that is, the standard trapezoid is more desirable.

Furthermore, the bank layer preferably has a thickness in a range from 6 to 20 μm, and more preferably from 10 to 16 μm. That is, the thickness may be 3 to 20 times, and more preferably 5 to 16 times greater than the thickness (from 1 to 2 μm) of PDL-1. The trapezoid section shape with such a size is beneficial for reducing both the critical dimension bias (CD bias) and the ink climbing. The thickness setting range is the optimal range for current ink material containing a wavelength converting material after balancing the optical conversion efficiency and the luminance. When the thickness is too small, the wavelength converting material such as QD has insufficient absorption proportion to the emitted light. When the thickness is too large, the wavelength conversion quantum efficiency will decrease due to quantum quenching after reaching a saturation value. If there is some advance in the ink formulation in future, the thickness may be further reduced, but should still be maintained at 6 μm or more.

Figure 7:
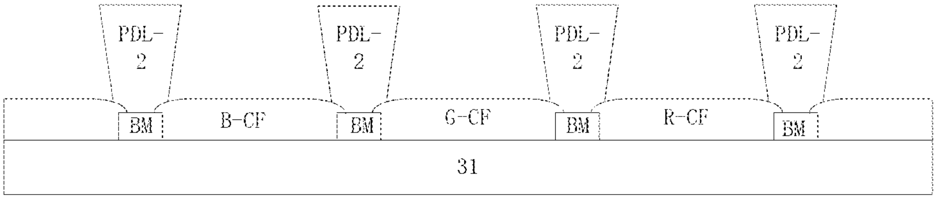
FIGS. 7(*a*)-7 (*e*) schematically show some embodiments of a wavelength converting color film substrate in a cell alignment mode of the present disclosure.
Figure 7:
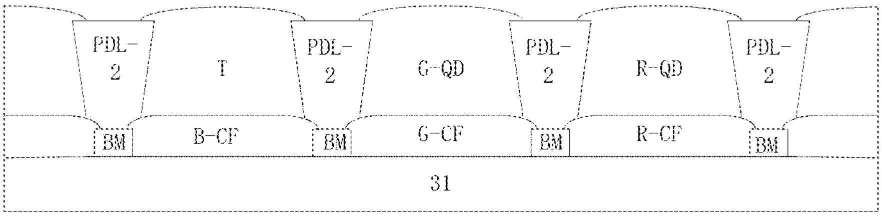
Figure 7:
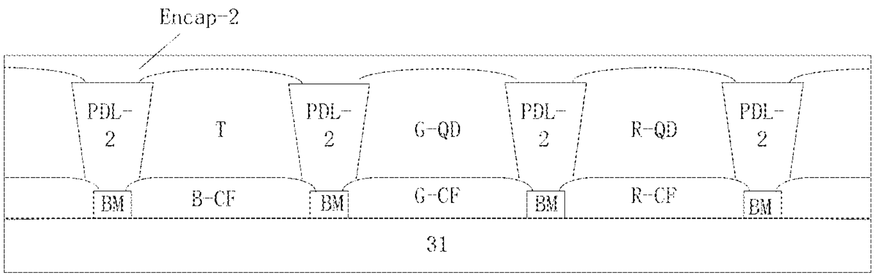
Figure 7:
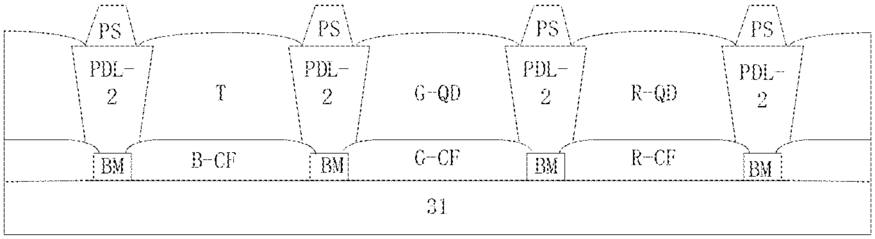
Figure 7:
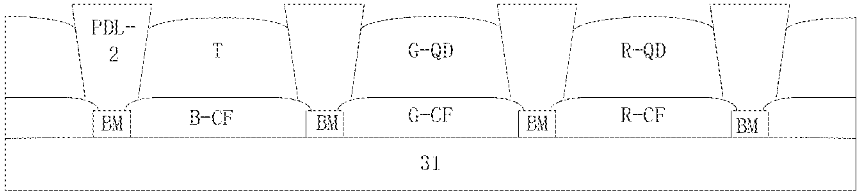

FIGS. 7(*a*)-7 (*e*) schematically show some embodiments of a wavelength converting color film substrate in Mode I. The wavelength converting color film substrate comprises a color film layer and a wavelength converting layer. FIG. 7(*a*) shows that PDL-2 is firstly formed on the black matrix to define spaces for the wavelength converting units and the transparent unit. FIG. 7(*b*) shows that green and red wavelength converting units, G-QD and R-QD, and the transparent unit, T, are formed into the above spaces by ink jet printing, and are respectively disposed on the green, red and blue color film units. FIG. 7(*c*) shows that a second encapsulation layer Encap-2 may be then formed. FIG. 7(*d*) shows that supporting pillars (PS) necessary for cell alignment may also be formed on PDL-2. FIG. 7(*e*) shows that in some embodiments, for example, when there is a difference in ink accommodation capacity due to uniformity control, the top surface of the wavelength converting layer may also be slightly lower than the top surface of PDL-2.

In practical preparation, a lyophobic material should be used for the bank layer, and taking the adhesive ability thereof to the substrate into consideration, its shape is affected by the preparation process.

Typically, the PDL-2 layer may be patterned by exposing and developing. That is, PDL-2 is formed by performing UV photocuring through light irradiation with a mask and then removing the uncured portion. At this time, colored PDL-2, for example, black PDL-2 is preferable. When PDL-2 is colored and has a large thickness, the material of the pixel defining layer close to the color film layer receives insufficient UV light to be cured, and is likely to be removed in developing, thereby forming an undercut. This in turn causes the angle between the lateral edge and the bottom edge of the trapezoid section to be within the previous preferred range of greater than 95°.

From the viewpoint of the optical properties, reflecting-type PDL-2 is also preferable. The reflecting-type PDL-2 may be a grey bank layer, which appears grey because of containing scattering particles, or a yellow bank layer having stronger reflecting effect on the yellow color wavelength ranges. The grey bank layer may provide appropriate reflection, and may be conveniently made into an inverse trapezoid or a normal trapezoid by controlling the exposing degree. The advantage of the yellow bank layer lies in that it is particularly beneficial for increasing the light extraction efficiency. The reflecting-type PDL-2 may also increase the reflecting effect by adding a lateral metal such as metal Al and an alloy through a photolithographic process. The metal layer may have a thickness in a range from 200 to 400 nm. That is, it may provide sufficient reflectivity, but does not influence the configuration of the bank layer. The use of the reflecting-type PDL-2 and corresponding increase in reflectivity is helpful for increasing the light extraction effect. The preparation of a reflecting metal layer on the lateral side of the second pixel defining layer may increase the optical wavelength conversion path of a blue light in the wavelength converting unit. Nevertheless, the reflecting-type PDL-2 with the metal layer added by photolithography will sometimes reduce the process window for patterning photolithography.

Preferably, the reflecting-type PDL-2 has a reflectivity in a range from 50% to 70% in the yellow light wavelength range, and a reflectivity in a range from 20% to 40% in the blue light wavelength range. When such a reflecting-type PDL-2 is used around the wavelength converting unit, a majority of blue light will be absorbed, while a majority of yellow light will be reflected, thereby increasing the light extraction efficiency.

The inventors have found that the reflecting property of PDL-2 to color light is also related to its thickness. For example, at different heights, the bank layer may have different reflectivities to various color lights. Both grey bank layer and yellow bank layer have a high reflectivity in the yellow light region with relatively large wavelength, while have a low reflectivity in the blue light region with a relatively short wavelength. For the grey PDL-2 bank layer, in the blue light region, the thickness nearly has no effect on the reflectivity, and in the yellow light region, the larger the thickness, the higher the reflectivity is. For the yellow PDL-2 bank layer, in the yellow light region, the larger the thickness, the higher the reflectivity is, while in the blue light region, when its thickness is smaller, especially less than 6 μm, the reflectivity in the blue light region is higher. Therefore, large PDL-2 thickness is advantageous, because it is ensured that the reflectively in the yellow light region is high, and the occurrence of high reflectivity in the blue light region is avoided. Therefore, from the viewpoint of reflecting effect, PDL-2 should have a thickness not less than 6 μm.

The features such as the material and the thickness of PDL-2 in Mode I are also applicable to other cases in the present disclosure, including but not limited to Modes II-IV. Nevertheless, the feature related to the lyophobicity is only applicable to the bank layer, i.e. PDL-2 in Modes I and III. For different materials for the bank layer, the lyophobicity thereof may be characterized by contact angle. Preferably, a contact angle of deionized water thereon should be ≥90°, and a contact angle of propylene glycol methyl ether acetate (PGMEA) thereon should be ≥35°.

The second pixel defining layer typically has a line width in a range from 10 to 50 μm, and preferably from 15 to 30 μm. In the present disclosure, the width of the widest portion of the second pixel defining layer is used as its line width. Typically, the largest width is used as the width of a critical geometric dimension, so as to determine the critical dimension in the photolithographic process for example. The resin thereof may be mainly cured by a conventional process at 230° C. More preferably, a lyophobic and colored resin which may be cured at a low temperature (for example, the curing condition at a temperature in a range from 85 to 105° C.) is used for preparing PDL-2.

Figure 8:
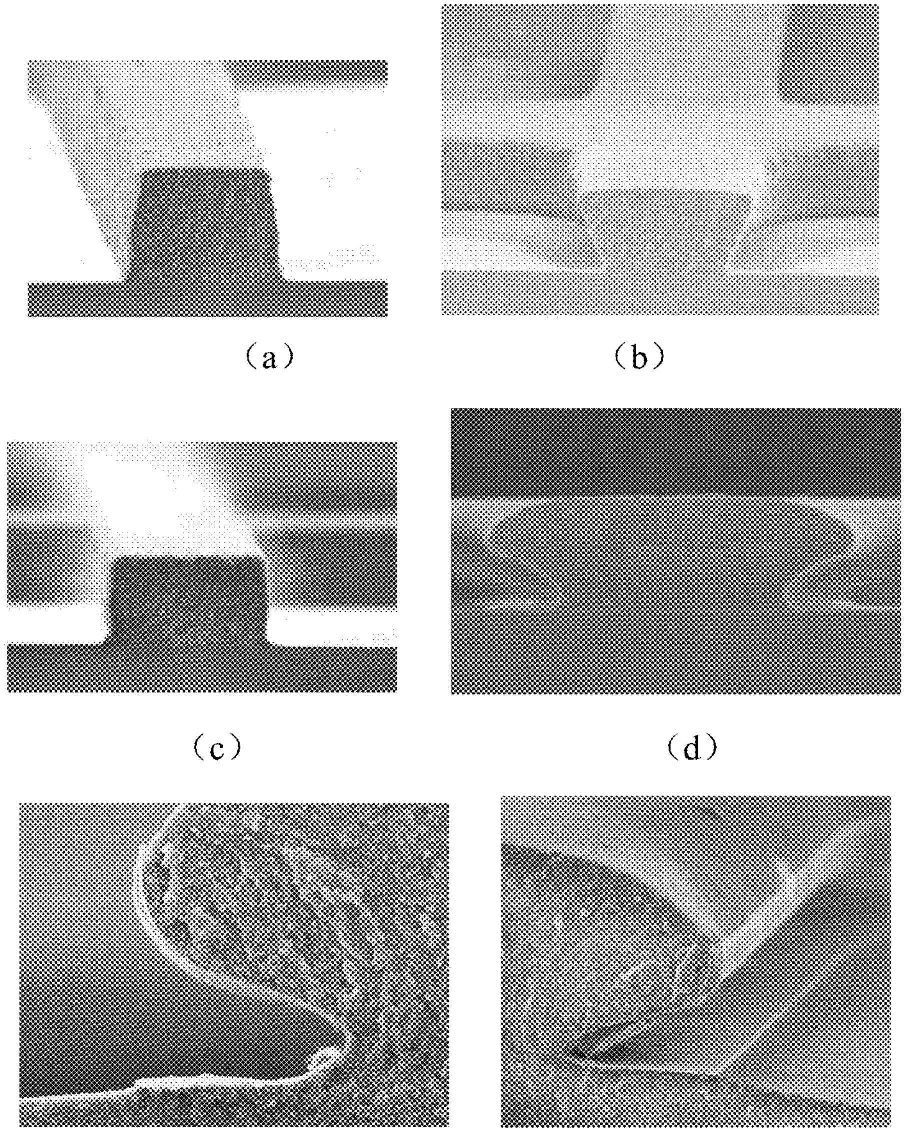
FIGS. 8(*a*)-(*f*) show micrographs of some second pixel defining layers.

FIGS. 8(*a*)-(*f*) show micrographs of some second pixel defining layers. FIG. 8(*a*) shows a normal trapezoid grey bank layer. FIG. 8(*c*) shows an inverse trapezoid grey bank layer. In the grey bank layer containing scattering particles, a normal trapezoid or inverse trapezoid section may be conveniently obtained by adjusting the photocuring parameters. FIG. 8(*c*) shows a yellow bank layer with a shape approximate to a rectangle, which is beneficial for increasing the reflection of red and green light and reducing the reflection of blue light. FIG. 8(*d*) shows a mushroom-shaped black bank layer, in which an undercut is easily formed by a photocuring process. FIG. 8(*e*) shows an inverse trapezoid bank layer which has a metal lateral side for reflection. FIG. 8(*e*) shows one side of the inverse trapezoid bank layer which has a metal lateral side for reflection, i.e. the bright edge. FIG. 8(*e*) shows an oblique view of the inverse trapezoid bank layer which has a metal lateral side for reflection.

In Mode I, after PDL-2, i.e. the bank layer, is formed on the color film layer, the wavelength converting units are prepared with an ink containing a wavelength converting material by ink jet printing.

In the space defined by the lyophobic bank layer, the ink containing a wavelength converting material is printed by ink jet printing and cured. Typically, the ink containing a wavelength converting material may be composed of a wavelength converting material (such as QD particles) and a matrix, and the matrix of the ink containing a wavelength converting material is photocurable. After curing, the layer of the ink containing a wavelength converting material is transformed into a wavelength converting resin film. Conventionally, the thickness range for the wavelength converting resin film may be extended to from 6 to 30 μm based on the thickness of the lyophobic bank layer (for example, from 6 to 20 μm), depending on the lyophobicity degree of the bank layer and the volume of the printed ink. As described above, the wavelength converting resin preferably has a thickness in a range from 10 to 20 μm. As described previously, the lyophobicity of the bank layer may be preferably such that a contact angle of deionized water thereon ≥90°, and a contact angle of propylene glycol methyl ether acetate (PGMEA) thereon ≥ 35°.

Figure 9:
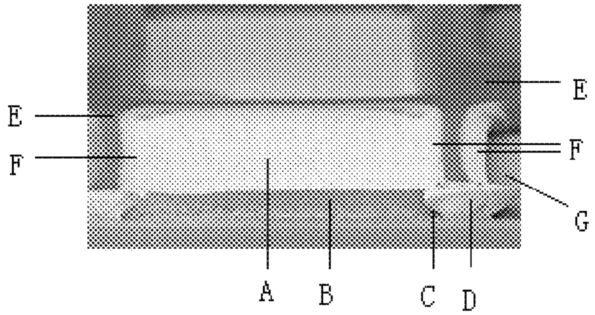
FIG. 9 shows a 45° top view SEM image of an embodiment where the wavelength converting units have been filled in single sub-pixel.

FIG. 9 shows a 45° top view SEM image of a wavelength converting unit defined by an inverse trapezoid second pixel defining layer in an embodiment. In the figure, Region A is the top surface of the cured wavelength converting unit, and Region B is its section. The inverse trapezoid, more specifically "mushroom-shaped" bank layer (i.e. the second pixel defining layer) is on both sides of the wavelength converting unit. Its side wall is represented by C, its section is represented by D, its top surface is represented by E, and the downward inclined edge of the top surface is represented by F. The wavelength converting unit is provided in the enclosed space in the middle of the bank layer. The space G defined by the bank layer which is not filled with an ink may be seen at the bottom right corner. This figure shows that by means of an inverse trapezoid lyophobic bank layer, ink jet printing may be well implemented, such that an ink containing a converting material is well filled in the space defined by the bank layer and cured to form the wavelength converting unit. If the color film layer is considered as the bottom side for observation, the angle between the lateral wall C and the bottom edge may be in a range from 80 to 140°, and preferably from 95 to 120°, appearing to be an inverse trapezoid. Accordingly, if the light emitting layer in the display panel is considered as the bottom side for observation, the angle between the lateral edge and the bottom edge may be in a range from 40 to 100°, and preferably from 60 to 85°.

Figure 10:
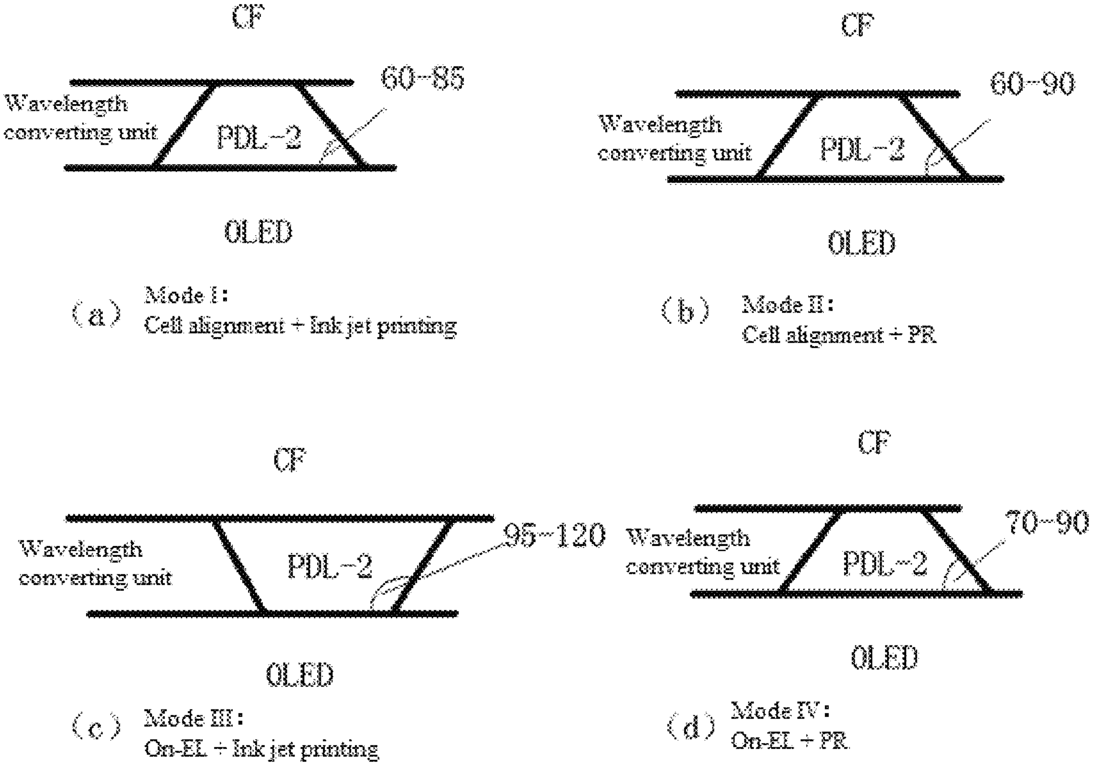
FIG. 10 schematically shows preferred angle ranges for Modes I-IV of the present disclosure.

FIG. 10(*a*) shows the preferred angle range for Mode I. It should be understood that the trapezoid shapes in FIGS. 10(*a*)-(*d*) are merely illustrative, and represent the characteristic quadrilaterals of corresponding modes.

After the preparation of the wavelength converting unit is completed, a second encapsulation layer Encap-2 may be further overlaid, as shown in FIG. 5(*c*). The second encapsulation layer covers the surface of the second pixel defining layer and the wavelength converting units to protect the prepared wavelength converting units. In the present disclosure, the second encapsulation layer is an encapsulation layer which protects the wavelength converting units after the wavelength converting units are formed, and the first encapsulation layer is an encapsulation layer which protects the light emitting units after the light emitting units are formed. The second encapsulation layer is optional. When a wavelength converting material with sufficiently high stability or a sufficiently good stack integration process is employed, it is also possible that the wavelength converting units do not need to be encapsulated.

Encap-2 may be a low stress and dense inorganic film, such as SiOx/SiNx/Al2O3, prepared by a low temperature process (≤180° C.), and specifically may be prepared by processes such as CVD and ALD. The film layer has a thickness less than 1 μm, and preferably less than 0.5 μm, and a refractive index in a range from 1.7 to 2.0, and preferably from 1.75 to 1.85, and is used for protecting the wavelength converting resin film layer and maintaining the wavelength conversion optical efficiency. Such a thickness range for the second encapsulation layer may reduce the thickness of the optical cell as described below, and reduce the crosstalk. Further, the film with such a refractive index also has a better compactness, which is more beneficial for protecting the wavelength converting resin film layer. Such a second encapsulation layer may also be used in Mode II.

Subsequently, the wavelength converting color film substrate comprising the color film layer and the wavelength converting layer is assembled with the already-prepared light emitting layer with cells aligned. Therebetween, a filler is filled, and supporting pillars are optionally provided, and a dam layer is provided on the periphery of the display panel to enclose the filling layer.

The dam layer and the filler may be applied and filled in a vacuum or nitrogen atmosphere. Specifically, in a vacuum or nitrogen atmosphere, on the light-exiting surface of the light emitting layer or the light-incoming surface of the wavelength converting layer, a material for the dam layer is applied on the periphery, and a filler is coated in the effective display area (AA) of the panel, and then two layers are attached close to each other and then precisely aligned with each other to achieve the cell alignment.

Here, the dam layer is photocured with a UV light. During the process, the effective display area is shielded with a mask to prevent the display property from being affected. The filler may be thermally cured at a low temperature (≤100° C.). The dam layer has a thickness in a range from 15 to 50 μm, preferably from 20 to 40 μm, and more preferably from 20 to 30 μm. The dam layer may be formed from a resin, and may contain fibrous or microsphere fillings with controlled particle size or thickness. The filler is preferably a low temperature curable resin (main curing temperature≤100° C., and preferably ≤90° C.), and has an outgas value≤100 ppm when it is baked at 100° C. for 2 hours after being cured. The cured filler has a thickness in a range from 5 to 30 μm, and preferably from 10 to 15 μm. Excessively thin filler and dam will influence the cell alignment performance of the parts on two sides, while excessively thick filler and dam will influence the display performance of the display panel. In particular, as the thickness of the filler increases, the area of the wavelength converting unit may increase, and the difference thereof from the light emitting area of the light emitting unit is positively correlated to the thickness of the optical cell (the distance between the light-incoming surface of the wavelength converting unit and the light-exiting surface of the light emitting unit, which may be the sum of the thickness of the filling layer and the thickness of the encapsulation layer). That is, the larger the thickness of the optical cell, the larger the difference between the area of the wavelength converting unit and the light emitting area of the light emitting unit is, so as to avoid the effect of cross color between pixels caused by excited light. The thickness of the optical cell is also correlated to the pixel design and the resolution. The higher the resolution, and the smaller the pixel design, and smaller the desired thickness of the optical cell is. Similarly, excessively large thickness of the optical cell may result in crosstalk between adjacent sub-pixels caused by reflected light.

Figure 11:
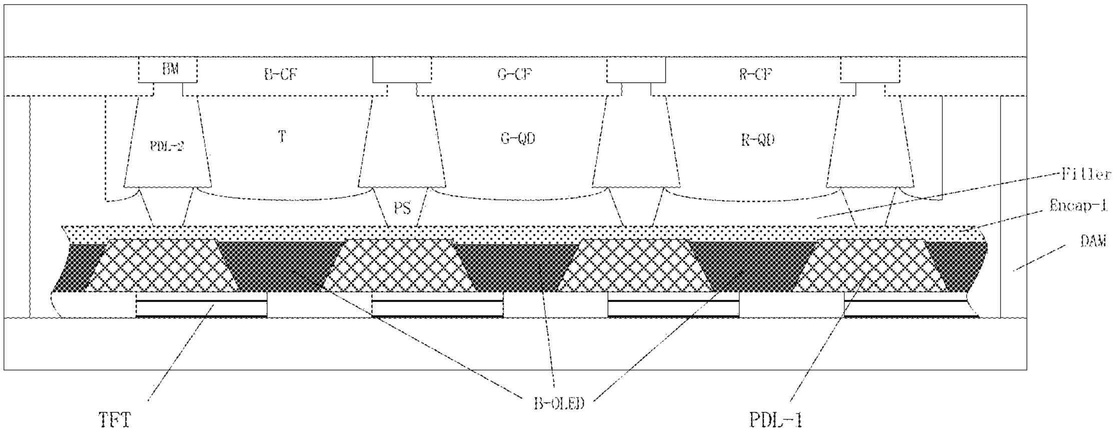
FIG. 11 schematically shows an embodiment of a display panel with cells aligned.

FIG. 11 schematically shows an embodiment of an QD-OLED display panel with cells aligned. A blue B-OLED light emitting layer is cell aligned with the QD wavelength converting color film substrate in FIG. 5(*d*) having supporting pillars PS, a filler is filled therebetween, and a dam layer is provided on the periphery, thereby assembling a display panel of an embodiment of the present disclosure. In the figure, T represents a transparent unit, G-QD and R-QD represent green and red QD wavelength converting units respectively, and B-CF, G-CF and R-CF represent color film units for three colors of blue, green and red respectively. FIG. 11 focuses on the description of the filler and the dam layer, and for the purpose of clearly describing various sub-pixels, OLEDs are depicted as being completely separated from each other by PDL-1. However, it should be understood that, as described above, the light emitting layers, the cathodes and the like in adjacent OLEDs may also be connected with each other over PDL-1.

The thickness of the dam layer in the present disclosure may be similar to that of a conventional dam layer, i.e. around 30 μm, while the thickness of the filling layer (calculated as the distance between the light emitting unit and the wavelength converting unit or transparent unit) may be reduced to between 5 and 10 μm, which is much less than the thickness of the filling layer in a conventional dam-filler structure (20 μm or more), thereby preparing a display panel with higher resolution and smaller sub-pixels.

In the present disclosure, supporting pillars may be formed either on the second pixel defining layer or on the first pixel defining layer. In some cases, there may be no supporting pillar, and the distance between the OLED light emitting unit and the wavelength converting unit or transparent unit is maintained only by the dam layer and the filler. The supporting pillars may be or may be not in direct contact with the pixel defining layer. Furthermore, supporting pillars may be selectively provided on only a portion of the pixel defining layer. The supporting pillars may be prepared by a common process in related art, and the distribution density thereof in the display panel may be appropriately designed. The supporting pillars are preferably prepared on the pixel defining layer between the red sub-pixel and the green sub-pixel which have larger opening areas, because both the optical high luminance sensitivity for green color and the process window capacity may be taken into consideration. On one hand, because human eyes are not sensitive to green color, there is a high requirement on luminance for the green sub-pixel. On the other hand, large physical sizes of the green and red sub-pixels may provide better processing capability for forming the supporting pillars.

In each sub-pixel of the display panel, the light-exiting surface of the light emitting unit is within an orthographic projection of the light-incoming surface of the wavelength converting unit in the light emitting layer. Preferably, the light-exiting surface of the light emitting unit is smaller than the light-incoming surface of the wavelength converting unit.

Figure 12:
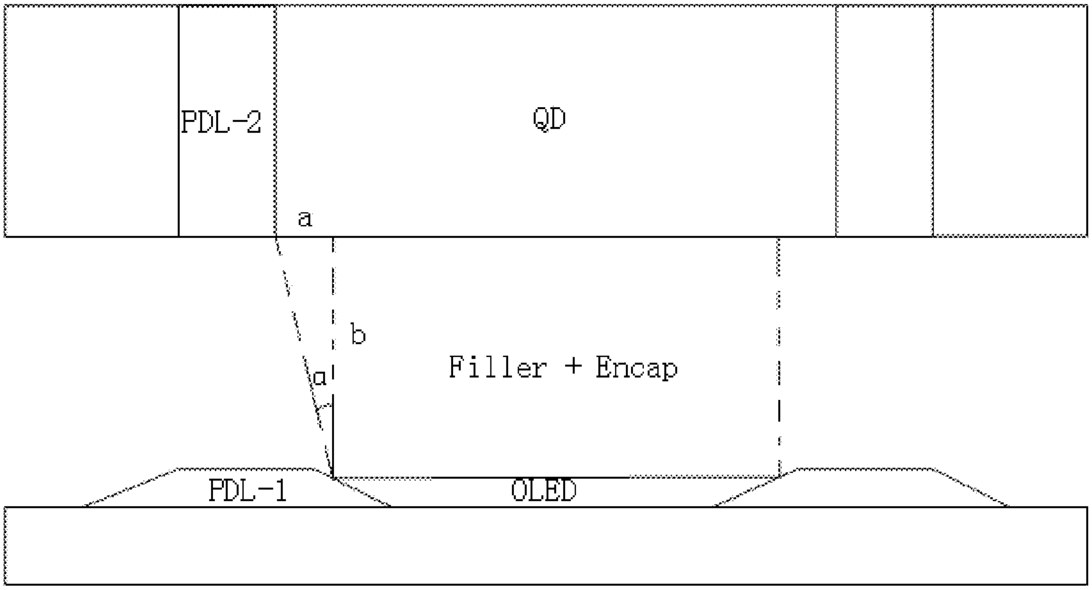
FIG. 12 shows the relationship among the light-exiting surface of the light emitting unit, the light-incoming surface of the wavelength converting unit and the cell thickness.

FIG. 12 shows the relationship among the light-exiting surface of the light emitting unit, the light-incoming surface of the wavelength converting unit and the cell thickness. In FIG. 12, the thickness between the light-exiting surface of the light emitting unit below and the bottom surface of the wavelength converting unit above is the cell thickness, and a filling layer (Filler) and optionally an encapsulation layer (Encap, such as a first encapsulation layer Encap-1 and a second encapsulation layer Encap-2) may be comprised within the cell thickness. If a lateral distance from the edge of the light-exiting surface of the light emitting unit to the edge of the light-incoming surface of the wavelength converting unit is assumed as a, and the cell thickness is assumed as b, then $a \leq 1.8b$. More preferably, a/b is not greater than tan 60° (i.e. $\alpha \leq 60°$, as shown in the figure). If the value of a/b is too large, then the light emitted by the light emitting unit enters into the wavelength converting unit at an angle deviating too much from the vertical direction, and the phenomenon of total reflection is likely to occur in the light output path in the stack structure of films with different refractive indexes, thereby influencing the light emitting efficiency.

Furthermore, the plurality of wavelength converting units may lap a surface of the second pixel defining layer close to the base substrate. The plurality of wavelength converting units may comprise a first color wavelength converting unit and a second color wavelength converting unit disposed adjacent to each other, wherein the first color wavelength converting unit and the second color wavelength converting unit have different lapping widths on the second pixel defining layer which separates the first color wavelength converting unit from the second color wavelength converting unit. The display panel may further comprise: a color film layer on a side of the wavelength converting unit away from the light emitting layer, wherein the color film layer comprises a plurality of color film units and a black matrix defining the plurality of color film units, the plurality of color film units lap a surface of the black matrix close to the base substrate, and a lapping width of the wavelength converting unit on the second pixel defining layer is different from a lapping width of the color film unit, which belongs to the same sub-pixel as the wavelength converting unit, on the black matrix.

In particular, for Mode I in which ink printing is used, the lapping width of the finally formed wavelength converting unit on the second pixel defining layer is preferably within 10% of a width of the surface, which is lapped, of the second pixel defining layer.

In the present disclosure, lapping means that the color film units, the wavelength converting units or the light emitting units respectively filled in the black matrix, the first pixel defining layer and the second pixel defining layer (which may be collectively referred to as unit defining layers) cover these unit defining layers at their top. If the top surface of the unit defining layer is a planar surface, then the lapping portion is a portion on the planar top surface. The horizontal distance from the edge of the lapping portion to the edge of the top surface is the lapping width.

FIG. 11 shows that the color film units lap a side of the black matrix close to the base substrate, and the wavelength converting units lap a side of the second pixel defining layer close to the base substrate. The lapping widths of them are different from each other. FIG. 11 shows that the lapping widths of adjacent wavelength converting units on the second pixel defining layer are substantially the same, but they may also be different, and each of the lapping widths is within 10% of the width of the surface, which is lapped, of the second pixel defining layer. In the embodiment as shown in FIG. 11, the surface which is lapped is the bottom surface of PDL-2.

Mode II: Forming the Wavelength Converting Layer by Photolithography and Assembling with Cells Aligned Mode II is the same as Mode I at least in the light emitting layer and the cell alignment process, and mainly differs from Mode I in that the wavelength converting units are formed by photolithography rather than ink jet printing.

In contrast to ink jet printing, the wavelength converting units are formed by directly coating a photoresist resin or a photoresist containing a wavelength converting material such as QD and patterning it through photolithography.

Like Mode I, before forming the wavelength converting units, a second pixel defining layer PDL-2 is prepared on the black matrix BM of the color film layer. Nevertheless, PDL-2 here is no longer the bank layer for ink jet printing. Therefore, it does not need to have a lyophobicity for in printing, and no longer serves as the bank layer. However, similar to the bank layer, in the characteristic quadrilateral of the section of the bank layer, a side thereof close to the base substrate is the first edge of its characteristic quadrilateral, because it is formed on a side of the base plate opposite to the base substrate side. Preferably, each of the angle between the second edge and the third edge and the angle between the second edge and the fourth edge thereof is in a range from 60° to 120°, and more preferably from 90° to 120°. Accordingly, each of the angle between the first edge and the third edge and the angle between the first edge and the fourth edge thereof is in a range from 60° to 120°, and preferably from 60° to 90°. The section may be a trapezoid (including rectangle), and when the side of the color film layer is considered as the bottom edge of the trapezoid, the angle between the lateral edge and the bottom edge is in a range from 60° to 120°, and preferably from 90° to 120°. Accordingly, if the light emitting layer after cell alignment is used as the bottom side, then the angle between the lateral edge and the bottom edge of the section of the bank layer is in a range from 60° to 120°, and preferably from 60° to 90°. Within the preferred angle range, the wavelength converting units formed by photolithography and defined thereby have high optical energy utilization. Outside of this angle range, the light energy loss increases.

FIG. 10(*b*) shows the preferred angle range for Mode II.

Preferably, PDL-2 has a thickness in a range from 6 to 12 μm. Relative to the ink containing a wavelength converting material, the resin has a higher density and takes up a smaller volume, so the PDL-2 therein may have a thickness slightly less than that in Mode I, but the lower limit for the thickness should be twice or more greater than that of PDL-1, and preferably 6 μm or more.

A photoresist resin containing a wavelength converting material, also known as a wavelength converting photoresist, may be coated on the entire surface of the color film layer formed with PDL-2 to fill the space defined by PDL-2. Then, unwanted portions of the wavelength converting photoresist are removed by photolithographic process such as irradiating with a mask, developing, and etching, and the wavelength converting photoresist is retained in a portion of the space defined by PDL-2 to realize the patterning, thereby forming a wavelength converting unit. Typically, for the red wavelength converting unit, the green wavelength converting unit and the transparent unit, different photoresists are coated, and for each of them, a photolithographic process is performed.

The baking curing temperature of the photoresist after developing is preferably ≤180° C., so as to reduce the effect of the thermal treatment on the material.

The transparent unit may be formed from a light diffusing resin containing scattering particles to ensure the consistency of the display view angles of various sub-pixels.

Preferably, the thickness of the wavelength converting unit is close to the thickness of PDL-2, and is in a range from 6 to 12 μm. Close thickness of them facilitates the window control of subsequent integration process, and contributes to the planarization in subsequent process, thereby maintaining the uniformity of the optical performance and the view angle.

Figure 13:
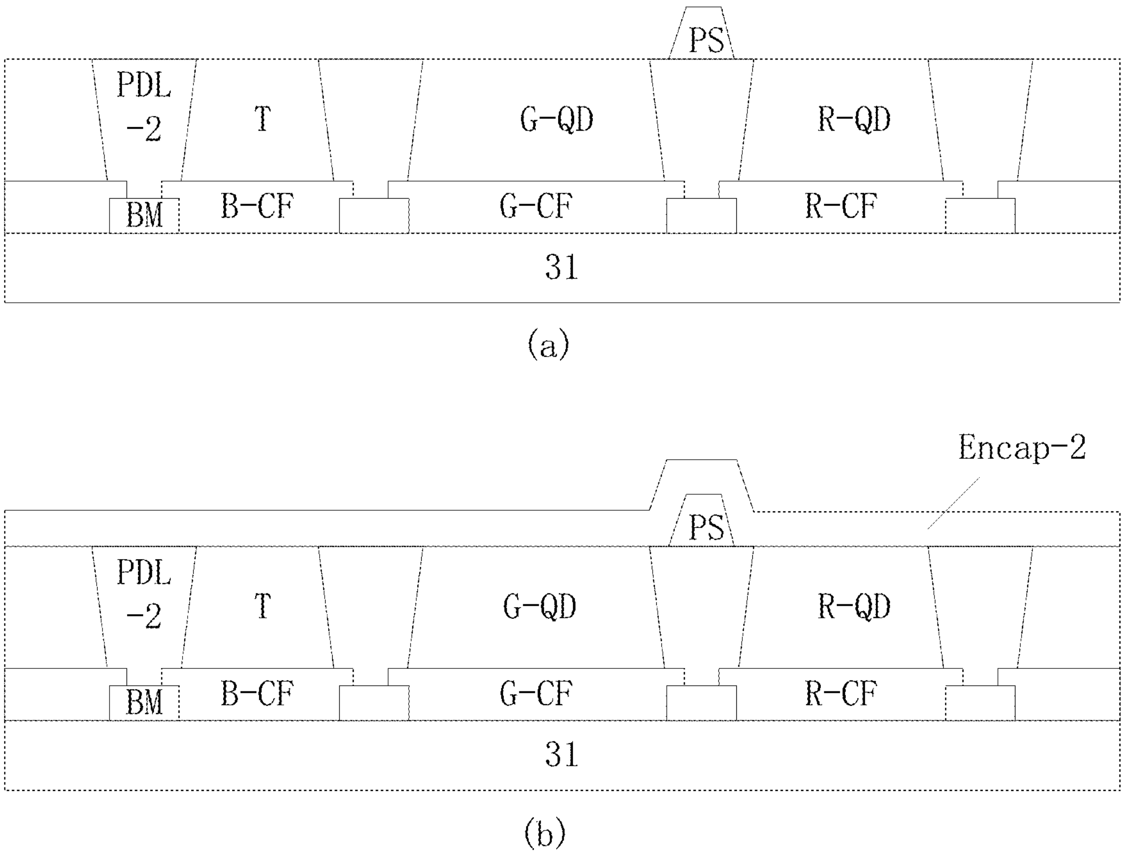
FIGS. 13(*a*)-(*b*) schematically show embodiments where wavelength converting units and a transparent unit are formed on a color film layer by photolithography.

FIGS. 13(*a*)-(*b*) schematically show embodiments where wavelength converting units and a transparent unit are formed on a color film layer by photolithography. FIG. 13(*a*) shows that PDL-2 appears to be a normal trapezoid (with the color film layer side as the bottom side) for the convenience of sufficiently filling the wavelength converting photoresist. This figure shows that the area of the green unit≥the area of the red unit≥the area of the blue unit. Furthermore, supporting pillars PS may be further formed on the top of PDL-2, and the figure shows that PS is only provided between the green sub-pixel and the red sub-pixel. As described above, this is because both the process window capacity and the optical high luminance sensitivity for G may be taken into consideration. As shown in the figure, the thickness of the wavelength converting units and the transparent unit, which are formed by photoresist coating and subsequent photolithographic process, is close to the thickness of PDL-2. As compared with ink jet printing, in photolithography, the thickness of the wavelength converting units may be adjusted more easily through the thickness of PDL-2. FIG. 13(*b*) shows that a second encapsulation layer Encap-2 may be further formed thereon.

After the wavelength converting color film substrate is prepared, the display panel may be prepared by performing steps such as cell aligning, in a process similar to that in Mode I.

It should be understood that except the difference in the wavelength converting unit and PDL-2, Modes I and II may use the same process parameters in most common parts. For example, the same color film layer, filling layer dam layer may be used.

Both Modes I and II are methods for manufacturing the display panel of the present disclosure, comprising:

- forming a second pixel defining layer on a color film layer as a base plate,
- forming a wavelength converting layer in a space defined by the second pixel defining layer by ink jet printing an ink containing a wavelength converting material or by coating and photoetching a photoresist containing a wavelength converting material to prepare a wavelength converting color film substrate, and
- assembling the wavelength converting color film substrate and the light emitting layer to the display panel with cells aligned, wherein a filling layer and a dam layer are provided between the wavelength converting color film substrate and the light emitting layer.

Preferably, the wavelength converting layer is formed by a low temperature process at a temperature≤180° C., including but not limited to forming PDL-2, the wavelength converting unit, and Encap-2.

Similar to Mode I, the plurality of wavelength converting units may lap a surface of the second pixel defining layer close to the base substrate. The plurality of wavelength converting units may comprise a first color wavelength converting unit and a second color wavelength converting unit disposed adjacent to each other, wherein the first color wavelength converting unit and the second color wavelength converting unit have different lapping widths on the second pixel defining layer which separates the first color wavelength converting unit from the second color wavelength converting unit. The display panel may further comprise: a color film layer on a side of the wavelength converting unit away from the light emitting layer, wherein the color film layer comprises a plurality of color film units and a black matrix defining the plurality of color film units, the plurality of color film units lap a surface of the black matrix close to the base substrate, and a lapping width of the wavelength converting unit on the second pixel defining layer is different from a lapping width of the color film unit, which belongs to the same sub-pixel as the wavelength converting unit, on the black matrix.

FIG. 13 shows that the color film units lap a side of the black matrix close to the base substrate, but does not show that the wavelength converting units lap the second pixel defining layer.

Mode III: On-EL Ink Jet Printing the Wavelength Converting Layer

The expression "on-EL" in the present disclosure refers to a process of forming a display panel by proceeding to form the wavelength converting layer and the color film layer on the light emitting layer, without cell alignment assembling.

Similar to Mode I, the wavelength converting units are formed by ink jet printing in Mode III. Mode III differs from Mode I in that the light emitting layer rather than the color film layer is used as a base plate for forming PDL-2 and subsequently forming the wavelength converting units.

Figure 14:
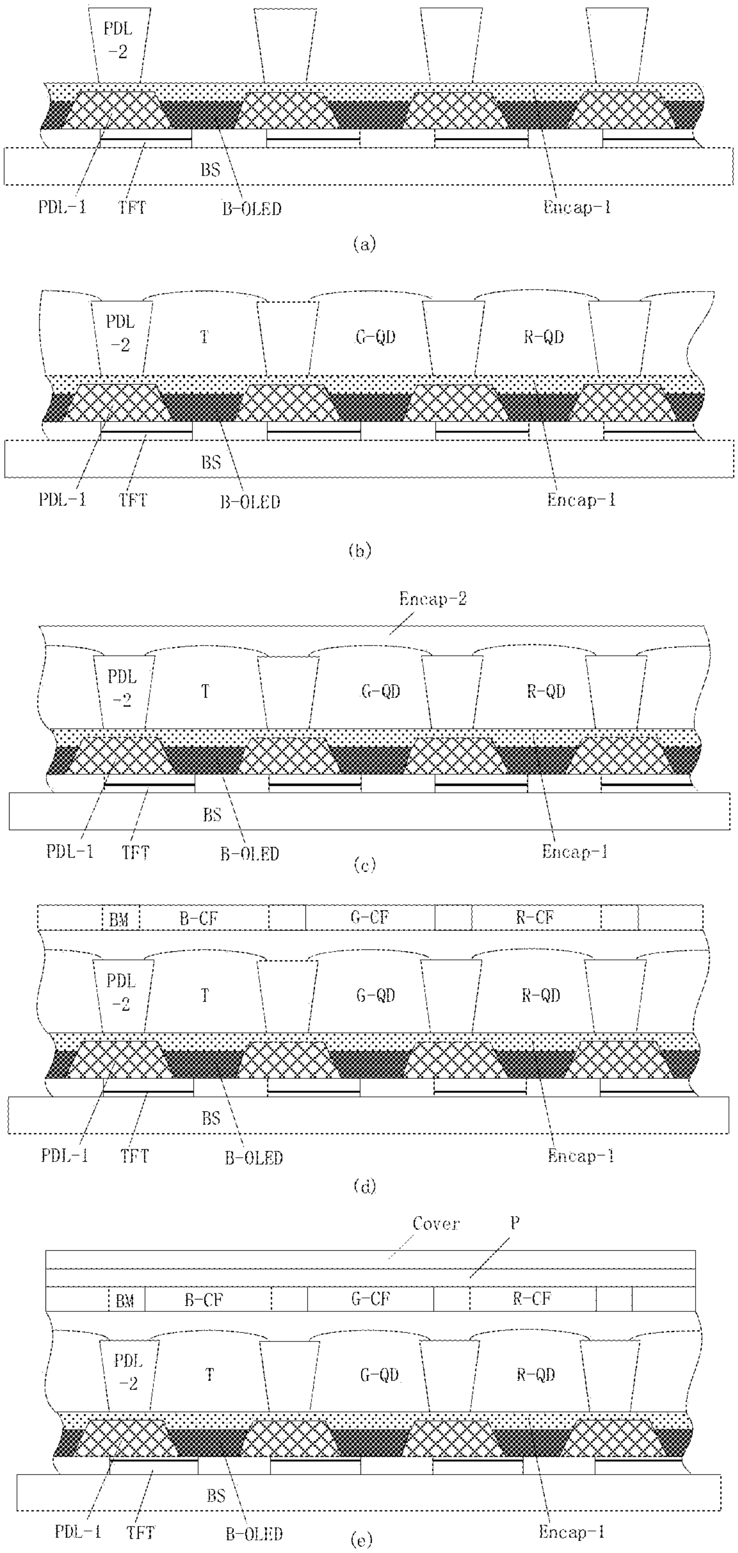
FIGS. 14(*a*)-(*e*) schematically show processes for forming a display device by on-EL and ink jet printing.

FIGS. 14(*a*)-(*e*) schematically show processes for forming a display panel by on-EL and ink jet printing. FIG. 14(*a*) shows that PDL-2 is firstly formed at the position corresponding to PDL-1 in the light emitting layer. FIG. 14(*b*) shows that QD wavelength converting units and transparent unit T are then formed in spaces defined by PDL-2 by ink jet printing. FIG. 14(*c*) shows that a second encapsulation layer may be then formed. FIG. 14(*d*) shows that a color film layer containing a black matrix is then formed. FIG. 14(*e*) shows that a reflecting-type polarizer P and a cover film Cover are finally formed. In FIG. 14, the legends in the light emitting layer are the same as those in the light emitting layer as shown in FIG. 2. As can be seen, in the on-EL mode, a filling layer may not be required to be filled.

In this mode, the characteristic quadrilateral of the sectional shape of PDL-2, because it is formed on a side of the base plate the same as the base substrate, a side thereof away from the base substrate is the first edge of its characteristic quadrilateral. Preferably, each of the angle between the second edge and the third edge and the angle between the second edge and the fourth edge thereof is in a range from 80° to 140°, and preferably from 95° to 120°. The section may be a trapezoid. Ideally, whether the display panel is formed by the on-EL process or the cell alignment process, from the optical viewpoint, all the most preferred angles of the shape of PDL-2 are similar to each other, and the sectional shape has a slightly wider top portion and a slightly narrower bottom portion. However, in view of the applicability of the ink jet printing process, PDL-2 here is still a bank layer, and the lyophobicity and climbing issue of the ink should be taken into consideration. In this case, similar to the situation where the color film layer serves as a base plate in Mode I, the angle between the lateral edge and the bottom edge of PDL-2 is in a range from 80° to 140°, and preferably from 95° to 120°, that is, the angle is compromised to some extent. It should be noted that this preferred range takes into consideration not only the optical properties, but also the difficulty of the process to achieve PDL-2 with such an angle. Although such an angle range does not achieve a wavelength converting unit with a slightly wider top portion and a slightly narrower bottom portion, a better display performance is still achieved in this preparation mode.

FIG. 10(*c*) shows the preferred angle range for Mode III.

PDL-2 preferably has a thickness in a range from 6 to 20 μm, and more preferably from 10 to 16 μm. That is, the thickness may be 3 to 20 times, and more preferably 5 to 16 times greater than the thickness (from 1 to 2 μm) of PDL-1. Such a trapezoid section shape is beneficial for reducing both the critical dimension bias (CD bias) and the ink climbing. The thickness setting range is the optimal range for current ink material containing a wavelength converting material after balancing the optical conversion efficiency and the luminance. If there is some advance in the ink formulation in future, the thickness may be further reduced, but should still be maintained at 6 μm or more.

Figure 15:
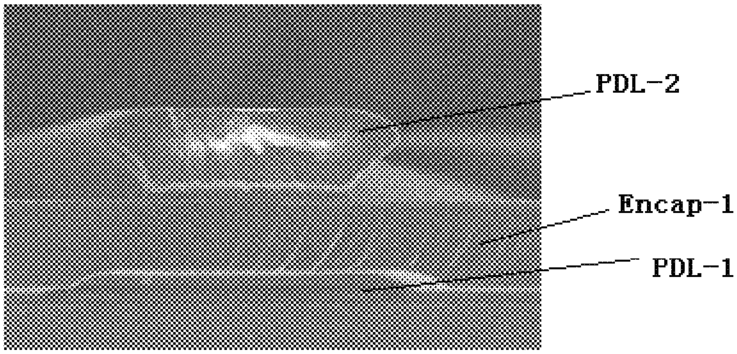
FIGS. 15(*a*)-(*b*) show micrographs of structures formed by on-EL and ink jet printing in embodiments of the present disclosure.
Figure 15:
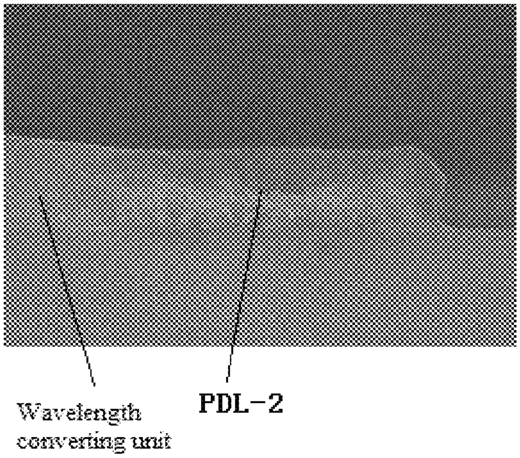

FIGS. 15(*a*)-(*b*) show micrographs of structures formed by on-EL and ink jet printing in an embodiment of the present disclosure. FIG. 15(*a*) shows a normal trapezoid PDL-1 below, a first encapsulation layer on PDL-1, and an inverse trapezoid PDL-2 on the first encapsulation layer. The light emitting units on both sides of PDL-1 have very thin thickness, which is invisible at this microscopic scale. FIG. 15(*b*) shows an inverse trapezoid PDL-2 and a wavelength converting unit formed by ink jet printing on its left side, where its right side has not been filled by ink jet printing.

The ink jet printing process is also used in Mode III. Therefore, similar to Mode I, in order to form a preferred undercut, a colored PDL-2, such as a black PDL-2, is preferable.

Also, similarly, reflecting-type PDL-2 is also preferable. The reflecting-type PDL-2 may be a grey bank layer containing scattering particles, or a yellow bank layer having stronger reflecting effect on the yellow color wavelength ranges. The reflecting-type PDL-2 may also increase the reflecting effect by adding a lateral metal such as metal Al and an alloy through a photolithographic process. The metal layer may have a thickness in a range from 200 to 400 nm. That is, it may provide sufficient reflectivity, but does not influence the configuration of the bank layer. The use of the reflecting-type PDL-2 and corresponding increase in reflectivity is helpful for increasing the light extraction effect. The preparation of a reflecting metal layer on the lateral side of the second pixel defining layer may increase the optical wavelength conversion path of a blue light in the wavelength converting unit. The angle between the lateral edge and the bottom edge of the reflecting-type PDL-2 is also in a range from 80° to 140°, and preferably from 95° to 120°.

For different materials for the second pixel defining layer, the lyophobicity thereof may be characterized by contact angle. Preferably, a contact angle of deionized water thereon should be ≥90°, and a contact angle of propylene glycol methyl ether acetate (PGMEA) thereon should be ≥35°.

The second pixel defining layer typically has a line width in a range from 10 to 50 μm, and preferably from 15 to 30 μm. Nevertheless, in Mode III, a lyophobic resin with a main curing temperature not higher than 100° C., rather than the conventional main curing temperature up to 230° C. in Mode I, should be selected for forming PDL-2. This is because the heat resistance of the light emitting layer as a base plate is worse than that of the color film layer.

In the space defined by the lyophobic bank layer, the ink containing a wavelength converting material is printed by ink jet printing and cured. Typically, the ink containing a wavelength converting material is composed of a wavelength converting material (such as QD particles) and a matrix, and the matrix of the ink containing a wavelength converting material is photocurable. After curing, the layer of the ink containing a wavelength converting material is transformed into a wavelength converting resin film. Conventionally, the thickness range for the wavelength converting resin film may be extended to from 6 to 30 μm based on the thickness of the lyophobic bank layer (for example, from 6 to 20 μm), depending on the lyophobicity degree of the bank layer and the volume of the printed ink. The wavelength converting resin preferably has a thickness in a range from 10 to 20 μm.

After the preparation of the wavelength converting unit is completed, a second encapsulation layer may be further overlaid. In Mode III, in view of the heat resistance of the light emitting layer, preferably, a low stress and dense inorganic film, i.e. an Encap-2 film layer, such as SiOx/SiNx/Al2O3, is prepared by an ultra-low temperature process (≤100° C.), and specifically may be prepared by processes such as CVD and ALD. The film layer has a thickness less than 1 μm, and preferably less than 0.5 μm, and a refractive index in a range from 1.7 to 2.0, and preferably from 1.75 to 1.85.

Then, the preparation of patterned black matrix BM and color films for various colors R-CF/G-CF/B-CF on Encap-2 proceeds, and also the ultra-low temperature process (≤100° C.) should be used. The thickness and optical requirements of the color film layer are the same as those in the cell alignment route.

In contrast to the cell alignment route, in the on-EL route, because the color film layer does not serve as the base plate for supporting PDL-2, a layer of reflecting-type polarizer, preferably a reflecting-type polarizer with a slightly higher reflectivity in the blue light wavelength range (for example, the DBEF film from 3M company or a photocured wide spectrum liquid crystal reflecting polarizing film), may be further prepared or attached on the color film layer. A scratch resistant cover film material with a high transmittance or another optical compensator film may be further attached thereon.

In general, in the on-EL route, no filling layer, dam layer or supporting pillar is provided, and the thickness of the optical cell may be further reduced. The on-EL-type device structure with a smaller thickness of the optical cell has greater room for productization. Nevertheless, because the heat resistance of the light emitting layer is less than that of the color film layer, there is relatively high requirement on the ultra-low temperature process in the on-EL route.

Furthermore, the plurality of wavelength converting units may lap a surface of the second pixel defining layer away from the base substrate. The plurality of wavelength converting units may comprise a first color wavelength converting unit and a second color wavelength converting unit disposed adjacent to each other, wherein the first color wavelength converting unit and the second color wavelength converting unit have different lapping widths on the second pixel defining layer which separates the first color wavelength converting unit from the second color wavelength converting unit. The display panel may further comprise: a color film layer on a side of the wavelength converting unit away from the light emitting layer, wherein the color film layer comprises a plurality of color film units and a black matrix defining the plurality of color film units, the plurality of color film units lap a surface of the black matrix close to the base substrate, and a lapping width of the wavelength converting unit on the second pixel defining layer is different from a lapping width of the color film unit, which belongs to the same sub-pixel as the wavelength converting unit, on the black matrix.

In particular, for Mode III in which ink printing is used, the lapping width of the finally formed wavelength converting unit on the second pixel defining layer is preferably within 10% of a width of the surface, which is lapped, of the second pixel defining layer.

FIG. 14 shows that the wavelength converting units lap a side of the second pixel defining layer close to the base substrate, but does not show that the color film units lap the black matrix.

Mode IV: On-EL Photoetching the Wavelength Converting Layer

Similar to Mode II, the wavelength converting units are formed by photolithography in Mode IV. Mode IV differs from Mode II in that the light emitting layer rather than the color film layer is used as a base plate for forming PDL-2 and subsequently forming the wavelength converting units.

Figure 16:
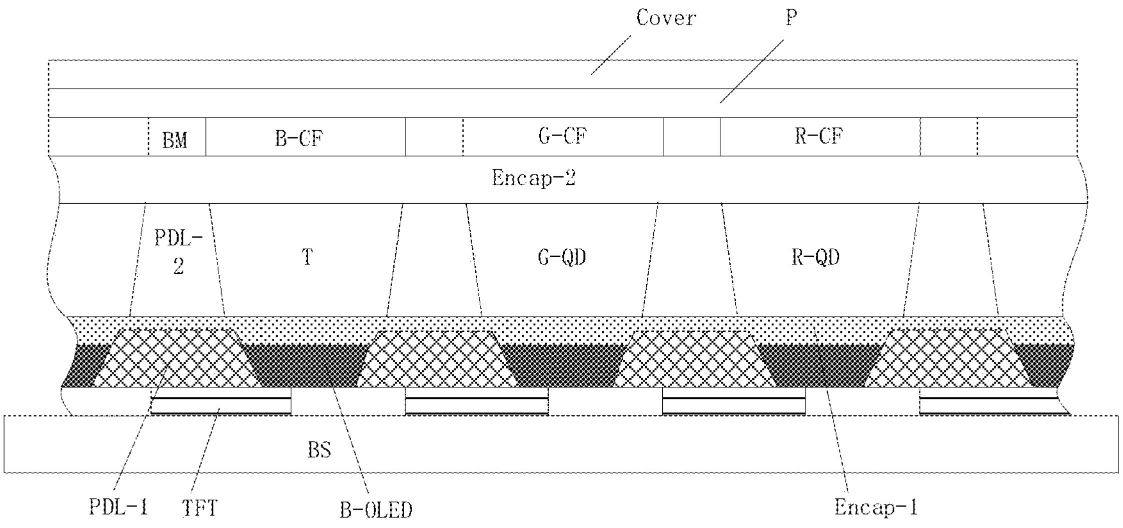
FIG. 16 schematically shows a display device formed by on-EL and photolithography.

FIG. 16 schematically shows a display panel formed by on-EL and photolithography. Here, the layer structure of the product is similar to the layer structure as shown in FIG. 14(*e*).

In this mode, the characteristic quadrilateral of the sectional shape of PDL-2, because it is formed on a side of the base plate the same as the base substrate, a side thereof away from the base substrate is the first edge of its characteristic quadrilateral. Preferably, each of the angle between the second edge and the third edge and the angle between the second edge and the fourth edge thereof is in a range from 60° to 100°. Preferably, the angle is in a range from 70° to 90°. The section may be a trapezoid or a quasi-rectangle. As described above, the most preferred angles for the shape of PDL-2 are such that the shape has a slightly wider top portion and a slightly narrower bottom portion. The angle between the lateral edge and the bottom edge of PDL-2 is also in a range from 60° to 100°. Preferably, the angle is in a range from 70° to 90° to form a space with a large opening and a small bottom, which facilitates the resin coating of the wavelength converting material. It should be noted that this preferred range takes into consideration not only the optical properties, but also the difficulty of the process to achieve PDL-2 with such an angle.

FIG. 10(*d*) shows the preferred angle range for Mode II.

Figure 17:
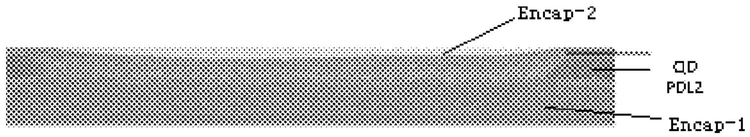
FIG. 17 shows a micrograph of a QD photoresist layer containing a down conversion material disposed in a sub-pixel space defined by PDL-2.

FIG. 17 shows a micrograph of a cured photoresist layer containing a QD wavelength converting material disposed in a sub-pixel space defined by PDL-2. As seen from the figure, the photoresist resin containing QD is sufficiently filled in the space defined by PDL-2. PDL-2 and QD units are formed on Encap-1, and Encap-2 is further overlaid on them.

Preferably, PDL-2 has a thickness in a range from 6 to 12 μm. Relative to the ink containing a wavelength converting material, the resin has a higher density and takes up a smaller volume, so the PDL-2 therein may have a thickness slightly less than that in Mode II, but the lower limit for the thickness should be twice or more greater than that of PDL-1, and preferably 6 μm or more.

Similar to Mode II, the wavelength converting units or the transparent unit is formed in the spaced defined by PDL-2 by photolithography. Mode IV differs from Mode II in that the baking curing temperature of the photoresist after developing is preferably ≤100° C., rather than ≤180° C. in the cell alignment route.

Also, preferably, the thickness of the wavelength converting unit is close to the thickness of PDL-2.

In Mode IV, a second encapsulation layer Encap-2 may also be formed.

The second encapsulation layer Encap-2 differs from that of Mode II in that a low stress and dense inorganic film, such as SiOx/SiNx/Al2O3, prepared by an ultra-low temperature process (≤100° C.) rather than a low temperature process (≤180° C.), and specifically may be prepared by processes such as CVD and ALD. The film layer has a thickness less than 1 μm, and preferably less than 0.5 μm, and a refractive index in a range from 1.7 to 2.0, and preferably from 1.75 to 1.85, and is used for protecting the wavelength converting resin film layer and maintaining the wavelength conversion optical efficiency. The Encap-2 film layer prepared by an ultra-low temperature process is not scratch resistant, and thus should be stored carefully.

In the ultra-low temperature process, if vacuum deposition is used, impurity gas in the wavelength converting units or the transparent unit, which has not been sufficiently released during the low temperature curing of the photolithographic process, may be further released, which is beneficial for further increasing the quality of the wavelength converting units or the transparent unit.

Similar to Mode III, the preparation of patterned black matrix BM and color films for various colors R-CF/G-CF/B-CF, and optional reflecting-type polarizer, cover film material or another optical compensator film on Encap-2 may proceed.

Specifically, then, the preparation of patterned black matrix BM and color films for various colors R-CF/G-CF/B-CF on Encap-2 proceeds, and also the ultra-low temperature process (≤100° C.) should be used. The thickness and optical requirements of the color film layer are the same as those in the cell alignment route.

In contrast to the cell alignment route, in the on-EL route, a layer of reflecting-type polarizer, preferably a reflecting-type polarizer with a slightly higher reflectivity in the blue light wavelength range (for example, the DBEF film from 3M company or a photocured wide spectrum liquid crystal reflecting polarizing film), may be further prepared or attached on the color film layer. A scratch resistant cover film material with a high transmittance or another optical compensator film may be further attached thereon.

Both Modes III and IV are methods for manufacturing the display panel of the present disclosure, comprising:

- forming a second pixel defining layer on a light emitting layer as a base plate,
- forming a wavelength converting layer in a space defined by the second pixel defining layer by ink jet printing an ink containing a wavelength converting material or by coating and photoetching a photoresist containing a wavelength converting material, and
- forming a color film layer on the wavelength converting layer to form the display panel.

Preferably, the wavelength converting layer is formed by an ultra-low temperature process at a temperature ≤100° C., including but not limited to forming PDL-2, the wavelength converting unit, Encap-2 and the color film layer.

Similarly, in Mode IV, the plurality of wavelength converting units may lap a surface of the second pixel defining layer away from the base substrate. The plurality of wavelength converting units may comprise a first color wavelength converting unit and a second color wavelength converting unit disposed adjacent to each other, wherein the first color wavelength converting unit and the second color wavelength converting unit have different lapping widths on the second pixel defining layer which separates the first color wavelength converting unit from the second color wavelength converting unit. The display panel may further comprise: a color film layer on a side of the wavelength converting unit away from the light emitting layer, wherein the color film layer comprises a plurality of color film units and a black matrix defining the plurality of color film units, the plurality of color film units lap a surface of the black matrix close to the base substrate, and a lapping width of the wavelength converting unit on the second pixel defining layer is different from a lapping width of the color film unit, which belongs to the same sub-pixel as the wavelength converting unit, on the black matrix.

In FIG. 16, no lapping occurs in both the wavelength converting units and the color film units.

Four modes for manufacturing the display panel of the present disclosure and some related preferred process parameters are described above. It should be understood that the material and process in the four modes may be used interchangeably unless specifically indicated, as long as this does not adversely affect the performance.

EXAMPLES

Example 1

Figure 18:
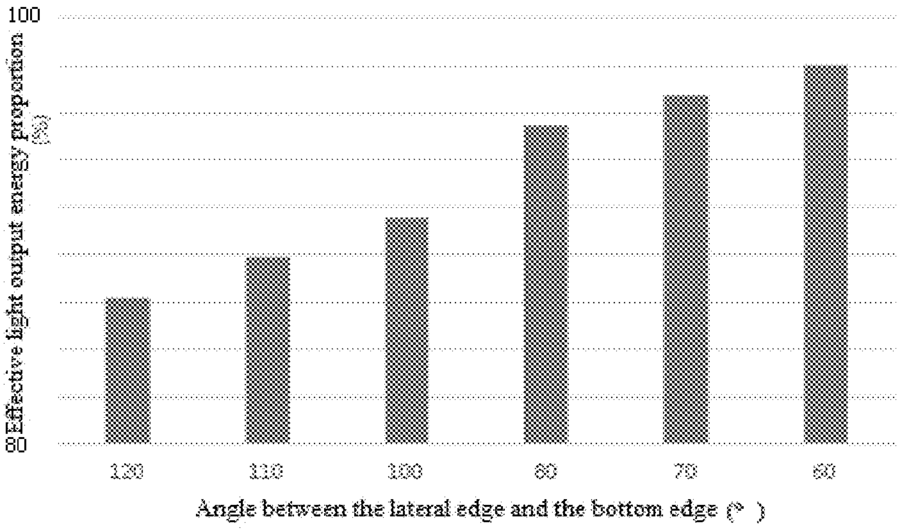
FIG. 18 shows the relationship between an angle between the lateral edge and the first edge of the trapezoid of the second pixel defining layer in a display panel manufactured according to Mode I of the present disclosure and the effective light output energy proportion in an embodiment of the present disclosure.

First color sub-pixels in 6 display panels of Mode I were prepared by ink jet printing and cell alignment. Those display panels differ from each other only in that they have different angles between each lateral edge and the bottom edge of the trapezoid section of the second pixel defining layer (i.e. the angle between the second edge and the third edge or between the second edge and the fourth edge of the characteristic quadrilateral), which are respectively 60°, 70°, 80°, 100°, 110° and 120°. Here, the bottom edge is the edge on the light emitting layer side, and the angle is the interior angle of the trapezoid. Subsequently, the effective light output energy proportions of those display panels were tested. The test results are shown in FIG. 18. The effective light output energy proportion refers to a ratio of the energy of the light emitted by the light emitting unit (a blue light emitted by the blue OLED in the present example), which is inferred from the observed wavelength-converted output light through the wavelength converting unit, to the light emission energy input into this pixel. The effective light output energy proportion is less than 100%, mainly because of the design of the light extracting structure, which results in that a portion of emitted light may enter another pixel, or may be transmitted out by the medium in the same layer.

As shown in FIG. 18, in the structure of Mode I, the effective light output energy proportion when the angle between the lateral edge and the bottom edge of the trapezoid section of the second pixel defining layer is 60°, 70° or 80° is significantly higher than that when the angle is 100°, 110° or 120°. This suggests that when the above angle is in the preferred range of the present disclosure, a light extracting structure with excellent effect is obtained.

Example 2

Figure 19:
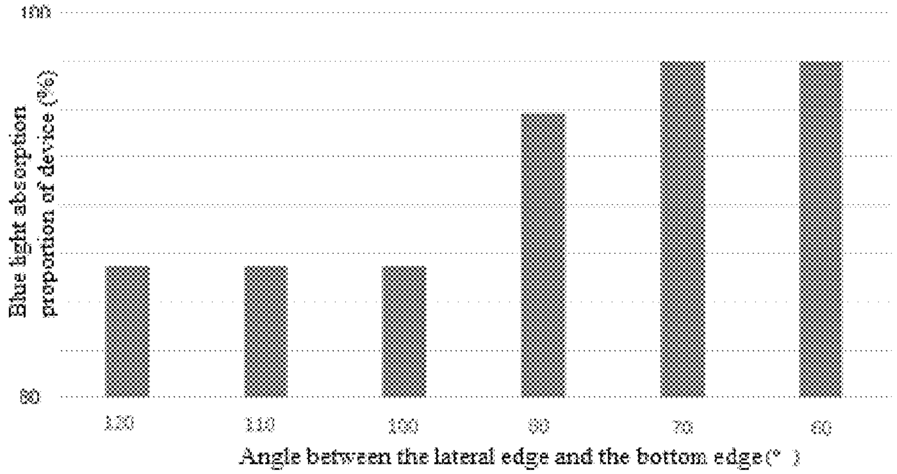
FIG. 19 shows the relationship between an angle between the lateral edge and the first edge of the trapezoid of the second pixel defining layer in a display panel manufactured according to Mode II of the present disclosure and the blue light absorption proportion of the device in an embodiment of the present disclosure.

6 display panels of Mode II were prepared by photolithography and cell alignment. Those display panels differ from each other only in that they have different angles between each lateral edge and the bottom edge of the trapezoid section of the second pixel defining layer (i.e. the angle between the second edge and the third edge or between the second edge and the fourth edge of the characteristic quadrilateral), which are respectively 60°, 70°, 80°, 100°, 110° and 120°. Here, the bottom edge is the edge on the light emitting layer side, and the angle is the interior angle of the trapezoid. Subsequently, the blue light absorption proportions of those display panels were tested. The test results are shown in FIG. 19. The blue light absorption proportion of a device refers to in a partial region of a plurality of sub-pixels, a ratio of the energy of the absorbed light excluding the leaked light to the energy of the light emitted by the light emitting unit in this region (a blue light emitted by the blue OLED in the present example). The blue light absorption proportion of a device is less than 100%, mainly because of the design of the light extracting structure.

As shown in FIG. 19, in the structure of Mode II, the blue light absorption proportion when the angle between the lateral edge and the bottom edge of the trapezoid section of the second pixel defining layer is 60°, 70° or 80° is significantly higher than that when the angle is 100°, 110° or 120°. This suggests that when the above angle is in the preferred range of the present disclosure, a light extracting structure with excellent effect is obtained.

As can be seen from a comparison between Examples 1 and 2, when the display panel having a wavelength converting layer was manufactured in the same cell alignment process but with different processes of preparing the wavelength converting units, the preferred ranges for the angle between the lateral edge and the bottom edge of the trapezoid section of the second pixel defining layer were totally different from each other. This clearly indicates that the geometric feature of the second pixel defining layer has significant effect on the optical properties of a device.

By designing the wavelength converting layer comprising the second pixel defining layer having a particular shape and the wavelength converting units defined thereby, and the light emitting layer and the color film layer cooperated therewith, the present disclosure provides a more compact light extracting structure, which may increase the light extraction efficiency of the display panel, thereby improving the luminescence efficiency and color gamut, and increasing critical optical properties.

Also provided is a display device comprising the display panel as described above, which may have excellent optical properties.

Obviously, modifications and variations on the embodiments of the present disclosure can be made by those skilled in the art without departing from the spirit and scope of the present application. As such, if these modifications and variations fall within the scopes of the claims of the present application or equivalents thereof, the present application is intended to encompass these modifications and variations.

What is claimed is:

1. A display panel comprising:

a base substrate, a light emitting layer on a side of the base substrate, and a wavelength converting layer on a side of the light emitting layer away from the base substrate, wherein the light emitting layer comprises a plurality of plurality of light emitting units and a first pixel defining layer defining the plurality of light emitting units, the wavelength converting layer comprises a plurality of wavelength converting units and a second pixel defining layer defining the plurality of wavelength converting units, and each of the plurality of wavelength converting units is configured to convert a wavelength of a light emitted by at least one of light emitting units, wherein in a direction perpendicular to the base substrate, the second pixel defining layer has a thickness twice or more that of the first pixel defining layer, the wavelength converting layer is in contact with a first encapsulation layer, and the first encapsulation layer is in contact with the light emitting layer, and wherein for a cross sectional shape of the second pixel defining layer in a direction perpendicular to the base substrate, a straight line passing through a point of the cross sectional shape furthest away from the base substrate and parallel to the base substrate is used as a first edge, a line segment passing through two ends of a boundary between the cross sectional shape and a neighboring layer on a side of the cross sectional shape close to the base substrate is used as a second edge, and straight lines passing through the two ends respectively and extending to the first edge and being tangent to the cross sectional shape are used as a third edge and a fourth edge respectively, wherein in a quadrilateral enclosed by the first, second, third and fourth edges, each of an angle between the second edge and the third edge and an angle between the second edge and the fourth edge is in a range from 95° to 120°.

2. The display panel according to claim 1, wherein, an area of a light-incoming surface of each of the wavelength converting units is greater than an area of a light-exiting surface of the light emitting unit which emits a light to be converted by the wavelength converting unit.

3. The display panel according to claim 1, wherein, an orthographic projection of the second pixel defining layer on the base substrate is within an orthographic projection of the first pixel defining layer on the base substrate.

4. The display panel according to claim 1, wherein, in a direction perpendicular to the base substrate, the first pixel defining layer has a thickness in a range from 1 to 2 μm, and the second pixel defining layer has a thickness in a range from 6 to 20 μm.

5. The display panel according to claim 1, further comprising:

a filling layer between the light emitting layer and the wavelength converting layer, and a dam layer, wherein the dam layer together with the light emitting layer and the wavelength converting layer encloses the filling layer.

6. The display panel according to claim 5, wherein, for a cross sectional shape of the second pixel defining layer in a direction perpendicular to the base substrate, a straight line passing through a point of the cross sectional shape closest to the base substrate and parallel to the base substrate is used as a first edge, a line segment passing through two ends of a boundary between the cross sectional shape and a neighboring layer on a side of the cross sectional shape away from the base substrate is used as a second edge, and straight lines passing through the two ends respectively and extending to the first edge and being tangent to the cross sectional shape are used as a third edge and a fourth edge respectively, wherein in a quadrilateral enclosed by the first, second, third and fourth edges, each of an angle between the first edge and the third edge and an angle between the first edge and the fourth edge is in a range from 60° to 90°.

7. The display panel according to claim 5, wherein, the dam layer has a thickness in a range from 15 to 50 μm, and the filling layer has a thickness in a range from 5 to 30 μm.

8. The display panel according to claim 5, wherein, the plurality of wavelength converting units lap a surface of the second pixel defining layer close to the base substrate.

9. The display panel according to claim 8, wherein, a lapping width of the wavelength converting units on the second pixel defining layer is within 10% of a width of the surface, which is lapped, of the second pixel defining layer.

10. The display panel according to claim 8, wherein, the plurality of wavelength converting units comprise a first color wavelength converting unit and a second color wavelength converting unit disposed adjacent to each other, wherein the first color wavelength converting unit and the second color wavelength converting unit have different lapping widths on the second pixel defining layer which separates the first color wavelength converting unit from the second color wavelength converting unit.

11. The display panel according to claim 8, further comprising:

a color film layer on a side of the wavelength converting unit away from the light emitting layer, wherein the color film layer comprises a plurality of color film units and a black matrix defining the plurality of color film units, the plurality of color film units lap a surface of the black matrix close to the base substrate, and a lapping width of the wavelength converting unit on the second pixel defining layer is different from a lapping width of the color film unit, which belongs to the same sub-pixel as the wavelength converting unit, on the black matrix.

12. The display panel according to claim 1, wherein, a contact angle of deionized water on a surface of the second pixel defining layer is >90°, and a contact angle of propylene glycol methyl ether acetate on the surface of the second pixel defining layer is >35°.

13. A display panel comprising:

a base substrate, a light emitting layer on a side of the base substrate, and a wavelength converting layer on a side of the light emitting layer away from the base substrate, wherein the light emitting layer comprises a plurality of light emitting units and a first pixel defining layer defining the plurality of light emitting units, the wavelength converting layer comprises a plurality of wavelength converting units and a second pixel defining layer defining the plurality of wavelength converting units, and each of the plurality of wavelength converting units is configured to convert a wavelength of a light emitted by at least one of the plurality of light emitting units, wherein in a direction perpendicular to the base substrate, the second pixel defining layer has a thickness twice or more that of the first pixel defining layer wherein the plurality of wavelength converting units lap a surface of the second pixel defining layer away from the base substrate, and wherein a ratio of a lateral distance from the edge of the light-exiting surface of the light emitting unit to the edge of the light-incoming surface of the wavelength converting unit to a vertical distance between the light-exiting surface of the light emitting unit and the bottom surface of the wavelength converting unit is less than or equals to 1.8.

14. The display panel according to claim 13, wherein, a lapping width of the wavelength converting units on the second pixel defining layer is within 10% of a width of the surface, which is lapped, of the second pixel defining layer.

15. The display panel according to claim 13, wherein, the plurality of wavelength converting units comprise a first color wavelength converting unit and a second color wavelength converting unit disposed adjacent to each other, wherein the first color wavelength converting unit and the second color wavelength converting unit have different lapping widths on the second pixel defining layer which separates the first color wavelength converting unit from the second color wavelength converting unit.

16. The display panel according to claim 13, further comprising:

a color film layer on a side of the wavelength converting unit away from the light emitting layer, wherein the color film layer comprises a plurality of color film units and a black matrix defining the plurality of color film units, the plurality of color film units lap a surface of the black matrix away from the base substrate, and a lapping width of the wavelength converting unit on the second pixel defining layer is different from a lapping width of the color film unit, which belongs to the same sub-pixel as the wavelength converting unit, on the black matrix.

17. A display device comprising the display panel according to claim 1.

18. The display panel according to claim 1, wherein, the first encapsulation layer comprises an inorganic layer containing a short pass structure.

19. The display panel according to claim 1, wherein, for a cross sectional shape of the first pixel defining layer in a direction perpendicular to the base substrate, a straight line passing through a point of the cross sectional shape furthest away from the base substrate and parallel to the base substrate is used as a first edge, a line segment passing through two ends of a boundary between the cross sectional shape and a neighboring layer on a side of the cross sectional shape close to the base substrate is used as a second edge, and straight lines passing through the two ends respectively and extending to the first edge and being tangent to the cross sectional shape are used as a third edge and a fourth edge respectively, wherein in a quadrilateral enclosed by the first, second, third and fourth edges, each of an angle between the second edge and the third edge and an angle between the second edge and the fourth edge is in a range from 20° to 40°.

20. A display panel comprising:

a base substrate, a light emitting layer on a side of the base substrate, and a wavelength converting layer on a side of the light emitting layer away from the base substrate, wherein the light emitting layer comprises a plurality of light emitting units and a first pixel defining layer defining the plurality of light emitting units, the wavelength converting layer comprises a plurality of wavelength converting units and a second pixel defining layer defining the plurality of wavelength converting units, and each of the plurality of wavelength converting units is configured to convert a wavelength of a light emitted by at least one of the plurality of light emitting units, wherein in a direction perpendicular to the base substrate, the second pixel defining layer has a thickness twice or more that of the first pixel defining layer, wherein a distance between a surface of a cathode away from the base substrate and a surface of the wavelength converting unit close to the base substrate is less than the thickness of the second pixel defining layer, and is greater than the thickness of the first pixel defining layer, and wherein a ratio of a lateral distance from the edge of the light-exiting surface of the light emitting unit to the edge of the light-incoming surface of the wavelength converting unit to a vertical distance between the light-exiting surface of the light emitting unit and the bottom surface of the wavelength converting unit is less than or equals to 1.8.

* * * * *